(12) United States Patent
Torii

(10) Patent No.: US 7,528,004 B2
(45) Date of Patent: May 5, 2009

(54) METHOD FOR MOUNTING ANISOTROPICALLY-SHAPED MEMBERS

(75) Inventor: Hideo Torii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/129,331

(22) Filed: May 29, 2008

(65) Prior Publication Data

US 2008/0293175 A1    Nov. 27, 2008

Related U.S. Application Data

(63) Continuation of application No. PCT/JP2007/052771, filed on Feb. 15, 2007.

(30) Foreign Application Priority Data

Mar. 10, 2006   (JP) .............................. 2006-066658

(51) Int. Cl.
   *H01L 51/40* (2006.01)
(52) U.S. Cl. .......................... 438/99; 977/742; 977/721
(58) Field of Classification Search ................ 438/99; 427/256; 977/721, 742, 762
   See application file for complete search history.

(56) References Cited

U.S. PATENT DOCUMENTS

| | | | |
|---|---|---|---|
| 6,093,623 A * | 7/2000 | Forbes ........................ | 438/455 |
| 6,417,025 B1 | 7/2002 | Gengel | |
| 6,872,645 B2 | 3/2005 | Duan et al. | |
| 6,929,760 B2 * | 8/2005 | Shimizu et al. ............. | 264/1.24 |
| 6,958,284 B2 * | 10/2005 | Ghyselen ................... | 438/458 |
| 7,064,045 B2 * | 6/2006 | Yang .......................... | 438/443 |
| 7,147,894 B2 * | 12/2006 | Zhou et al. ................. | 427/256 |
| 7,190,049 B2 * | 3/2007 | Tuominen et al. .......... | 257/618 |
| 7,276,389 B2 * | 10/2007 | Kim et al. .................... | 438/34 |
| 7,276,424 B2 * | 10/2007 | Wei ............................ | 438/406 |
| 7,294,292 B2 * | 11/2007 | Akutsu et al. .............. | 264/1.24 |
| 7,335,395 B2 * | 2/2008 | Ward et al. ................... | 427/198 |

(Continued)

FOREIGN PATENT DOCUMENTS

EP    1 453 086 A2    9/2004

(Continued)

OTHER PUBLICATIONS

Drobac, Stan, "Fluidic Self-Assembly Could Change the Way FPDs Are Made: A new way of incorporating single-crystal-silicon pixel switches, drivers, and system electronics in virtually any FPD back plate could created cheaper, better-performing displays," Information Display Nov. 1999, pp. 12-16.

(Continued)

*Primary Examiner*—Walter L Lindsay, Jr.
(74) *Attorney, Agent, or Firm*—McDermott Will & Emery LLP

(57) ABSTRACT

A mounting method of the present invention includes the steps of: (I) disposing a first liquid in a first region provided on one principal surface of a substrate; (II) bringing a pillar-like member as an anisotropically-shaped member, disposed on one principal surface of a transfer substrate in a predetermined orientation, into contact with the first liquid disposed in the first region, so as to move the pillar-like member to a region of the first liquid; and (III) removing the first liquid from the substrate.

10 Claims, 19 Drawing Sheets

U.S. PATENT DOCUMENTS

| | | | |
|---|---|---|---|
| 7,345,002 B2 * | 3/2008 | Schaper | 438/782 |
| 7,354,850 B2 * | 4/2008 | Seifert et al. | 438/604 |
| 7,416,019 B2 * | 8/2008 | Osiander et al. | 165/96 |
| 2001/0023986 A1 * | 9/2001 | Mancevski | 257/741 |
| 2001/0035556 A1 | 11/2001 | Itoh | |
| 2004/0023514 A1 | 2/2004 | Moriya et al. | |
| 2004/0235406 A1 * | 11/2004 | Duescher | 451/527 |
| 2005/0189883 A1 | 9/2005 | Suh et al. | |
| 2006/0281385 A1 * | 12/2006 | Song et al. | 445/50 |
| 2007/0075619 A1 * | 4/2007 | Jiang et al. | 313/336 |
| 2007/0099336 A1 * | 5/2007 | Weston et al. | 438/99 |
| 2007/0113779 A1 * | 5/2007 | Wong et al. | 117/84 |
| 2007/0218202 A1 * | 9/2007 | Ajayan et al. | 427/249.1 |
| 2008/0116465 A1 * | 5/2008 | Moon et al. | 257/79 |
| 2008/0223824 A1 * | 9/2008 | Ogawa et al. | 216/41 |

FOREIGN PATENT DOCUMENTS

| | | |
|---|---|---|
| EP | 1 547 970 A2 | 6/2005 |
| EP | 1 679 752 A1 | 7/2006 |
| JP | 2001-249626 | 9/2001 |
| JP | 2003-5212 | 1/2003 |
| JP | 2004-500247 | 1/2004 |
| JP | 2004-71654 | 3/2004 |
| JP | 2004-507083 | 3/2004 |
| JP | 2004-282063 | 10/2004 |
| JP | 2005-186270 | 7/2005 |
| JP | 2005-244240 | 9/2005 |
| JP | 2005-252242 | 9/2005 |
| JP | 2007-67299 | 3/2007 |
| WO | WO 01/34765 A1 | 5/2001 |
| WO | WO 02/15240 A1 | 2/2002 |
| WO | WO 2005/043639 A1 | 5/2005 |
| WO | WO 2005/076358 A1 | 8/2005 |

OTHER PUBLICATIONS

Wang, D., et al., "Germanium nanowire field-effect transistors with $SiO_2$ and high-κ $HfO_2$ gate dielectrics", Applied Physics Letters, Sep. 22, 2003, pp. 2432-2434, vol. 83 No. 12, American Institute of Physics.

Huang, et al., "Directed Assembly of One-Dimensional Nanostructures into Functional Networks", Science, Jan. 26, 2001, pp. 630-633, vol. 291, www.sciencemag.org.

* cited by examiner

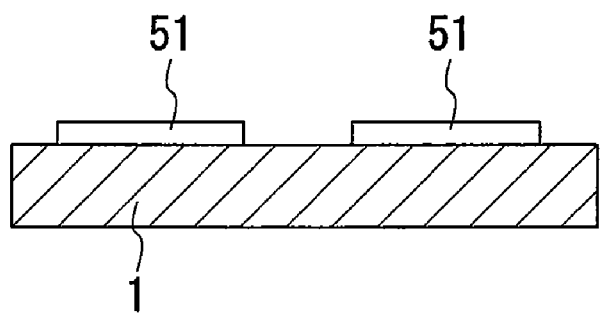
F I G. 5A
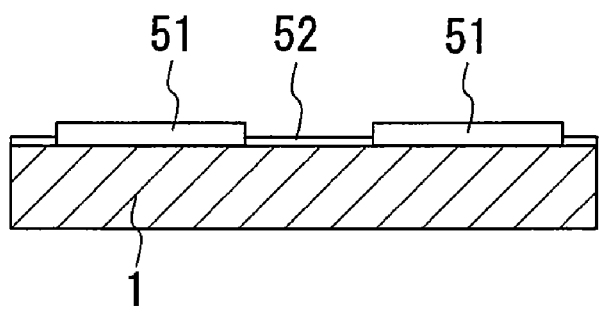
F I G. 5B
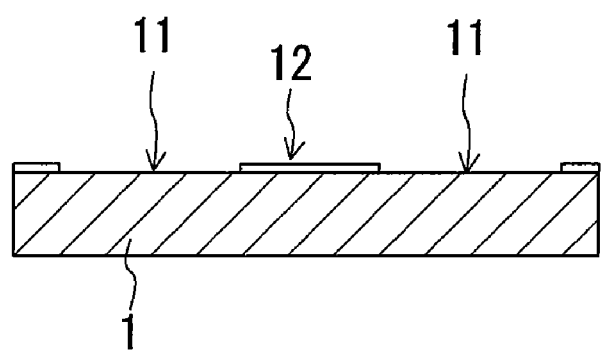
F I G. 5C

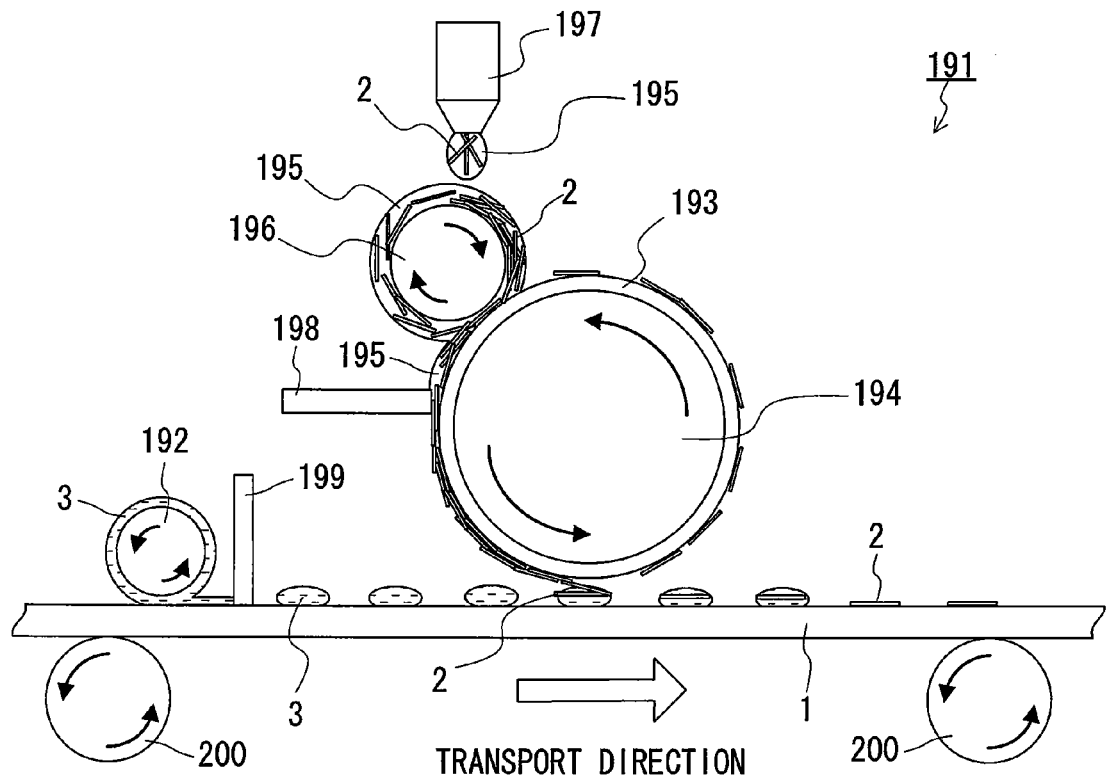
FIG. 19A
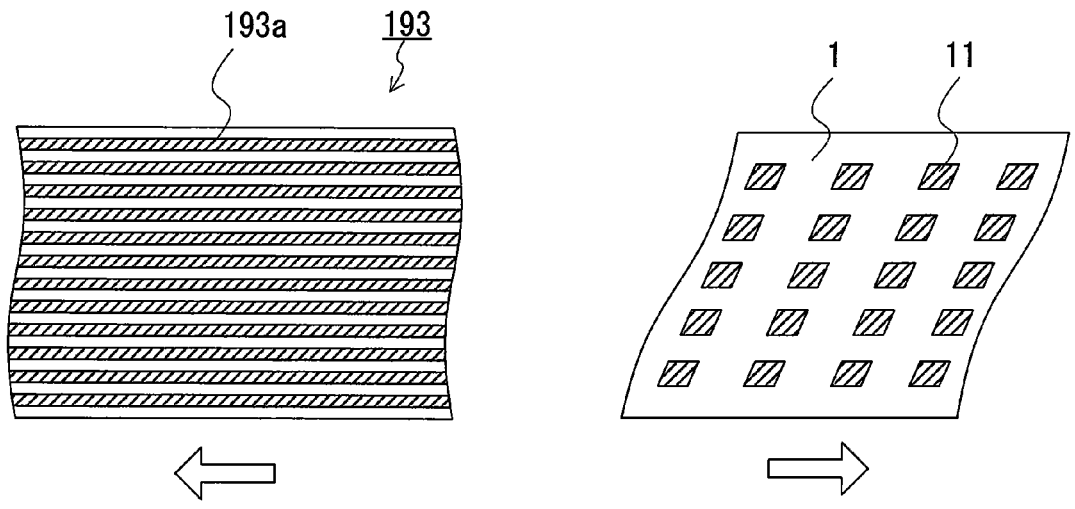
FIG. 19B
FIG. 19C

METHOD FOR MOUNTING ANISOTROPICALLY-SHAPED MEMBERS

RELATED APPLICATIONS

This application is a continuation of International Application No. PCT/JP2007/052771, filed on Feb. 15, 2007, which in turn claims the benefit of Japanese Application No. 2006-066658, filed on Mar. 10, 2006, the disclosures of which Applications are incorporated by reference herein.

BACKGROUND OF THE INVENTION

1. Field of the Invention

The present invention relates to a method for mounting anisotropically-shaped members.

2. Description of the Related Art

For the fabrication of thin-film transistors (TFTs) used for flat panel displays such as active-matrix liquid crystal display devices and organic electroluminescence display devices, and transistors used for large-scale integrated (LSI) circuits, a micro fabrication process is employed that processes a thin-film material by vacuum thin film techniques and photolithography techniques. With the recent trend for large-screen display devices that have been pervasive these days, the display device in particular requires large manufacturing facilities such as the exposure equipment used for photolithography processes. This has necessitated large investments on plants and facilities. The cost of photomask has been increasing as well.

With the recent advance in nanotechnology, various ideas have been put forth and research and development has been active on electronic devices using, for example, pillar-like members having a diameter smaller than several hundred nanometers (may be referred to as "nanomembers" hereinafter). The pillar-like nanomembers include needle-like nanoparticles, for example, such as carbon nanotubes and semiconductor nanowires. An application of such nanomembers for an electronic device is described, for example, by D. Wang, et al., "Germanium nanowire field-effect transistors with $SiO_2$ and high-k $HfO_2$ gate dielectric", Appl. Phys. Lett. Vol. 83, pp. 2432, 2003, which describes operations of field-effect transistors (may be referred to as FETs) with semiconductor nanowires at ordinary temperature. The field-effect transistors using such nanomembers are fabricated by a coating technique, and as such the fabrication does not require techniques using various kinds of large-scale vacuum equipment as required in conventional thin film techniques. Conceivably, the technique disclosed in this publication has many advantages, including cost reduction.

However, in order to realize transistor characteristics using nanomembers, the nanomembers need to be disposed in predetermined microscopic regions in a uniaxial orientation. This is necessary because field-effect transistors can be realized by forming a source electrode and a drain electrode at the both ends of each pillar-like nanomember that has been disposed in a uniaxial orientation. One of the big challenges, in order to fabricate the field-effect transistors of a coating type using nanomembers, is therefore the precise control of the orientation and position of the nanomembers in mounting the nanomembers on the substrate. For example, as a method of controlling the orientation and position of the nanomembers, there has been reported a method in which a mold made of polydimethylsiloxane (PDMS) with large numbers of grooves is brought into contact with a substrate surface to form channels for flowing a liquid, and a liquid in which the nanomembers are dispersed is flown through the channels to coat the substrate with pillar-like nanomembers in a particular orientation (referred to as "flow method" hereinafter) (see U.S. Pat. No. 6,872,645; Y. Huang, et al., "Directed Assembly of One-Dimensional Nanostructures into Functional Networks," Science vol. 291, pp. 630, 2001).

In another method for disposing and orienting the nanomembers on a substrate, a transfer sheet (donor sheet) is used on which the nanomembers have been oriented and disposed, and the nanomembers are transferred to a substrate that has been provided with an adhesive layer (buffer layer), as disclosed, for example, in JP2005-244240A. In this method, the transfer sheet is temporarily bonded to the adhesive layer of the substrate, and the patterns to be transferred are heated by irradiation of a laser beam to bond the nanomembers formed on the transfer sheet to the adhesive layer (transfer of the nanomembers to the substrate). The transfer sheet is formed of a transfer layer (a layer of nanomembers to be transferred) and an underlayer (a film holding the transfer layer). The underlayer includes a film whose adhesion deteriorates by the heat of a laser beam.

Meanwhile, active-matrix liquid crystal display devices and organic electroluminescence display devices are formed on a glass substrate. The pixels disposed in a matrix on the substrate are controlled by the transistors provided in the vicinity of the pixels. With current technology, however, crystalline semiconductor transistors cannot be formed on the glass substrate, and for this reason FETs using an amorphous silicon or polysilicon thin film have been used for the control of the pixels. The amorphous silicon or polysilicon thin film has the advantage that it can be formed on a large-area substrate at low cost; however, its smaller mobility compared with crystalline silicon has prevented them from operating at high speed. To overcome such a problem, there have been proposed techniques in which the FETs are first fabricated on a silicon wafer of crystalline silicon in a large quantity and then cut into individual pieces to be disposed on a substrate that has been provided with openings of a size for setting the FETs (see U.S. Pat. No. 6,417,025; JP2003-5212A; Information Display, p. 12-16, 1999).

However, when the conventional flow method is used to control the orientation and position of the pillar-like nanomembers in mounting these members on a substrate, there are difficulties in stably orienting and positioning the members.

Further, in the method of disposing the nanomembers by transferring the nanomembers onto the substrate provided with the adhesive layer, the nanomembers are anchored on the adhesive layer in the orientation the nanomembers are oriented on the transfer sheet. In placing the nanomembers on the transfer sheet, while the nanomembers can be aligned substantially parallel to one another along the longitudinal direction, it is very difficult to align the nanomembers with the ends of the nanomembers lined up. For this reason, it has been difficult with this method to dispose the nanomembers on the substrate substantially parallel to one another along the longitudinal direction with the ends of the nanomembers lined up in substantially in line. Another drawback of this method in that, because the adhesive layer is used, there are cases where the nanomembers are buried in the adhesive layer, which may lead to problems such as failing to realize transistor characteristics.

When conventional methods are used to dispose fabricated members such as FETs and a silicon sheet on a substrate, a problem arises that the FETs or silicon sheet cannot be oriented and disposed accurately in predetermined positions. Because the probability of accurately disposing the members on the substrate is small, larger numbers of members need to be prepared than necessary. This increases the manufacturing cost.

SUMMARY OF THE INVENTION

Under these circumstances, an object of the present invention is to provide a novel mounting method for accurately mounting anisotropically-shaped members such as pillar-like nanomembers on predetermined positions of a substrate, when mounting these members on the substrate.

A mounting method of an anisotropically-shaped member of the present invention is a method for mounting an anisotropically-shaped member on a substrate, and the method includes the steps of: (I) disposing a first liquid in a first region provided on one principal surface (A) of the substrate; (II) bringing the anisotropically-shaped member, disposed on one principal surface (B) of a transfer substrate in a predetermined orientation, into contact with the first liquid disposed in the first region, so as to move the anisotropically-shaped member to a region of the first liquid; and (III) removing the first liquid from the principal surface (A).

As used herein, the "anisotropically-shaped member" refers to members that are anisotropic in shape. Specific examples include pillar-like members (for example, cylindrical members) and plate-like members. The anisotropically-shaped member is shaped such that, for example, the average length of the long axis exceeds the average length of the short axis by greater than 1.5 fold. When the anisotropically-shaped member is a pillar-like member (for example, a cylindrical member), the average length of the long axis exceeds the average length of the short axis preferably by greater than 30 fold, and, in the case of a plate-like member, preferably by greater than 2 fold. As used herein, the "region of the first liquid" encompasses both inside and the surface of the first liquid.

In a mounting method of the present invention, the anisotropically-shaped member is disposed in a predetermined orientation on the transfer substrate in advance, and then transferred and disposed in a predetermined region on the substrate. This enables the anisotropically-shaped member to be mounted, with good probability, in a predetermined region on the substrate in a predetermined orientation. For example, when the anisotropically-shaped member is a micro pillar-like member, the member can be mounted in a predetermined region with good reproducibility because there is no need to utilize the liquid flow as in the flow method. As a result, fewer numbers of pillar-like members are required for mounting, and cost can be reduced accordingly. Further, in the present invention, the anisotropically-shaped member is transferred to the substrate by moving the anisotropically-shaped member to the liquid (first liquid) disposed in a predetermined region (first region) on the substrate. In this way, the anisotropically-shaped member can move inside the first liquid to be disposed in a predetermined region as long as the anisotropically-shaped member on the transfer substrate is partially in contact with the first liquid on the substrate during the transfer, even when the transfer substrate is slightly misaligned with the substrate in the transfer process. That is, with a mounting method of the present invention, the anisotropically-shaped member more stably can be mounted in a predetermined region in a predetermined orientation compared with conventional methods. Further, when the anisotropically-shaped member is a pillar-like member for example, the pillar-like members that have moved to the region of the first liquid can move over a short distance along the longitudinal direction inside the first liquid, so that the pillar-like members are aligned not only along the longitudinal direction but the ends of the pillar-like members are substantially in line, even when the ends of the pillar-like members are not aligned on the transfer substrate.

When the anisotropically-shaped member is a plate-like member such as a component chip including an electronic device like an FET, or a sheet-like semiconductor, a mounting method of the present invention eliminates the need to provide larger numbers of members than necessary as required in conventional methods. Further, because the plate-like member is disposed in a predetermined region without fail, the step of detecting whether the plate-like member has been mounted in a predetermined position can be simplified or omitted.

As used herein, the term "mount" means disposing electronic devices as well as members on a substrate.

BRIEF DESCRIPTION OF THE DRAWINGS

FIG. 5A to FIG. 5C are cross sectional views showing the steps of forming a micro pattern of first regions on a substrate used in a mounting method of the present invention.

FIG. 19A is a schematic diagram showing another example of a mounting apparatus of the present invention, FIG. 19B is a plan view showing a portion of a surface of a blanket, and FIG. 19C is a perspective view showing a portion of a substrate.

DETAILED DESCRIPTION OF THE PREFERRED EMBODIMENTS

Figure 1A:
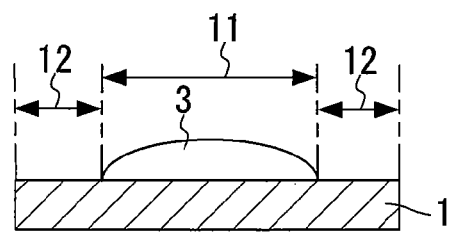
FIG. 1A to FIG. 1E are cross sectional views schematically showing respective steps according to one embodiment of a mounting method of the present invention.

The following will describe embodiments of the present invention. In the drawings referred to in the description below, hatching may be omitted for clarity. Further, in the following, like elements may be indicated with the same reference numerals and explanations for the like elements may be omitted.

<Mounting Method>

A mounting method of the present invention is a method for mounting an anisotropically-shaped member on a substrate, and the method includes the steps of:

(I) disposing a first liquid in a first region provided on one principal surface (A) of the substrate;

(II) bringing the anisotropically-shaped member, disposed on one principal surface (B) of a transfer substrate in a predetermined orientation, into contact with the first liquid disposed in the first region, so as to move the anisotropically-shaped member to a region of the first liquid; and (III) removing the first liquid from the principal surface (A).

According to this method, the first region is provided in a predetermined region where the anisotropically-shaped member is to be mounted, and the first liquid is disposed in the first region. The anisotropically-shaped member disposed on the substrate is then moved (transferred) to the region of the first liquid by maintaining the orientation, thereby disposing the anisotropically-shaped member in the first region. By subsequently removing the first liquid from the principal surface (A) of the substrate, the anisotropically-shaped member can be mounted in the first region in a predetermined orientation without fail.

The following describes each step of a mounting method of the present invention in more detail.

[Step (I)]

In order to accurately mount the anisotropically-shaped member in a predetermined region, it preferable that the first liquid disposed in the first region do not spread from the first region. To prevent the first liquid from spreading outward from the first region, it is preferable to surround the first region by a second region that is less wettable than the first region with respect to the first liquid. More specifically, the first region and the second region surrounding the first region are provided on one principal surface (A) of the substrate, and the second region is rendered less wettable than the first region with respect to the first liquid. In this way, the first liquid disposed in the first region does not easily spread outward from the first region, making it possible to stably dispose the first liquid in the first region. The first region and the second region with such different degrees of wettability may be realized by forming these regions such that the first region has a greater surface energy than the second region.

Further, in order to more stably dispose the first liquid in the first region, it is preferable that the wettability with respect to the first liquid be greatly differ between the first region and the second region. Since the degree of wettability is also related to the surface tension of the first liquid, the values of the surface energies of the first region and the second region are not limited. However, the first liquid can be stably disposed in the first region when, for example, the surface energy of the second region is 5 mJ/m$^2$ or greater to less than 40 mJ/m$^2$ (preferably, 5 to 25 mJ/m$^2$), and when the surface energy of the first region is 40 mJ/m$^2$ or greater (preferably 60 to 1000 mJ/m$^2$). Note that, in the following, the wettability with respect to the first liquid may be referred to as "liquid-attracting" when it is large, and "liquid-repelling" when it is small. For example, when the first liquid contains water, the high wettability with respect to the first liquid will be referred to as "hydrophilic", and the small wettability with respect to the first liquid will be referred to as "water-repelling". The wettability of a solid surface with respect to the first liquid is related to both the surface energy of the solid and the surface tension of the first liquid, and as such the value of the surface energy of the solid, characterized as either "liquid-attracting" or "liquid-repelling," is not particularly limited. However, the surface energy is preferably 40 mJ/m$^2$ or greater (preferably 60 to 1000 mJ/m$^2$) when the surface is "liquid-attracting," and 5 mJ/m$^2$ or greater to less than 40 mJ/m$^2$ (preferably 5 to 25 mJ/m$^2$) when the surface is "liquid-repelling."

As an example, the second region may be formed by providing at least a portion of the second region with an organic film which is less wettable than the first region with respect to the first liquid. In this way, the first region and the second region can be formed easily.

The amount of the first liquid disposed in the first region is not particularly limited. However, in order to allow the anisotropically-shaped member to stay in the region of the first liquid by maintaining the orientation on the transfer substrate in step (II), it is preferable that the first liquid be used in such an amount that the anisotropically-shaped member does not move to such an extent as to change the orientation in the first liquid.

Examples of the first liquid include an organic solvent, water, and a mixture of organic solvent and water. Some of the examples are alcohols such as methanol, ethanol, ethylene glycol, and glycerine; water; a mixture of such alcohol and water; and the like.

[Step (II)]

In step (II), the anisotropically-shaped member, disposed on the transfer substrate prepared in advance, is brought into contact with the first liquid on the principal surface (A) of the substrate. Here, the transfer substrate is oriented in a predetermined direction with respect to the principal surface (A) of the substrate, taking into consideration the orientation of the anisotropically-shaped member disposed on the transfer substrate, and the orientation of the anisotropically-shaped member that results when it is mounted on the substrate. The anisotropically-shaped member oriented and disposed on the transfer substrate makes contact with the first liquid confined in the first region, and moves into the region of the first liquid by the surface tension of the first liquid. Here, because the anisotropically-shaped member is transferred to the first region by maintaining the orientation on the transfer substrate, the anisotropically-shaped member can be disposed in the first region in a predetermined orientation without fail.

The following will describe an example of a fabrication method of a transfer substrate having the anisotropically-shaped member disposed thereon.

In order to prepare such a transfer substrate, a mounting method of the present invention may include the following step (i), which is performed before step (II) using a transfer substrate in which grooves extending in a predetermined direction are formed on the principal surface (B) of the transfer substrate:

(i) flowing a second liquid, containing the anisotropically-shaped member dispersed therein, onto the principal surface (B) having the grooves, so as to dispose the anisotropically-shaped member on the principal surface (B) in a predetermined orientation.

The transfer substrate may be provided on a roller surface such that the grooves on the principal surface (B) extend along the peripheral direction of the roller. In this case, in step (II), the anisotropically-shaped member may be moved to the region of the first liquid by rotating the roller to bring the principal surface (B) of the transfer substrate into contact with the first liquid disposed in the first region of the substrate. Further, in step (i), a member supply roller holding on its surface the second liquid containing the anisotropically-shaped member dispersed therein may be brought into contact with the principal surface (B) of the transfer substrate, so as to flow the second liquid containing the anisotropically-shaped member dispersed therein onto the principal surface (B).

According to this method, the anisotropically-shaped member can be disposed in a predetermined orientation by appropriately setting the width of the grooves according to the shape of the anisotropically-shaped member. For example, when the anisotropically-shaped member is a pillar-like member, the grooves are formed such that the width of the grooves is shorter than the long axis of the pillar-like member. In this way, the pillar-like member can be oriented such that its long axis is along the grooves. The second liquid used to disperse the anisotropically-shaped member is not particularly limited as long as the anisotropically-shaped member can be dispersed therein. For example, methanol, ethanol, propyl alcohol, chloroform, dichlorobutane, and the like can be used. In the transfer process, the second liquid may remain on the transfer substrate. In this case, it is preferable that the second liquid do not mix with the first liquid. For this reason, the second liquid preferably should be a liquid that does not easily mix with the first liquid. For example, when the first liquid is water, chloroform and dichlorobutane, neither of which readily mixes with water, suitably can be used as the second liquid.

[Step (III)]

In step (III), the first liquid is removed from the principal surface (A) of the substrate. The method of removing the first liquid is not particularly limited. For example, the first liquid may be removed by natural drying, or under heat and/or reduced pressure.

By the step of removing the first liquid from the first region, the anisotropically-shaped member is disposed in the first region by maintaining the orientation. By appropriately adjusting the amount of the first liquid disposed in the first region in the manner described above, the orientation of the anisotropically-shaped member in the first liquid can be maintained more reliably.

By the foregoing steps, the anisotropically-shaped member can be mounted in a predetermined region of the substrate in a predetermined orientation without fail.

With a mounting method of the present invention, a plurality of anisotropically-shaped members can be mounted at once. Specifically, a plurality of anisotropically-shaped members accurately can be disposed in predetermined regions by the foregoing method when a plurality of first regions is provided on the principal surface (A) of the substrate and by disposing the first liquid in each first region.

The substrate used to mount the anisotropically-shaped members is not limited. For example, a substrate may be used that is formed of an inorganic material, a high-molecular resin material, or a composite material of inorganic material and high-molecular resin material. The inorganic material may be ceramics (such as alumina), silicon, glass, or the like. The high-molecular resin material may be polyimide resin, polyamide resin, epoxy resin, polycarbonate resin, or the like. An example of the composite material of inorganic material and high-molecular resin material is a composite material including a fiber made of glass, ceramic, or metal, and a high-molecular resin material. A SOI substrate or a compound semiconductor substrate having an insulating film on its surface also may be used because the substrate material may be conductive as long as the substrate surface is insulated.

In the following, description is made as to the members and the shape of the first region, by considering cases where the mounted anisotropically-shaped members are pillar-like members, particularly micro pillar-like members such as nanowires, and plate-like members such as component chips and sheet-like semiconductors. As used herein, the "micro pillar-like members" refers to, for example, pillar-like members having a maximum diameter of at most 1 μm, and preferably at most 500 nm. In the following, such pillar-like members may be referred to as "nanomembers."

The following describes the case where the mounted anisotropically-shaped members are pillar-like members.

When the mounted members are pillar-like members, the shape of the first region may be decided according to the shape of the pillar-like members to be mounted. For example, when the first region is rectangular in shape, the first region may be shaped such that the length along the width direction is shorter than the long axis of the pillar-like members, or equal to or longer than the long axis of the pillar-like members. As used herein, the "width direction" means the direction orthogonal to the longitudinal direction of the first region when it is rectangular in shape. In a mounting method of the present invention, the pillar-like members are oriented and disposed on the transfer substrate in advance and then transferred and disposed in the first region. Thus, the pillar-like members can be disposed in a predetermined orientation without fail, even when the length of the first region along the width direction is equal to or longer than the long axis of the pillar-like members. In a mounting method of the present invention, the length of the first region along the width direction may be set, for example, in a range at least 0.8 times to at most 1.5 times the length of the long axis of the pillar-like members. In this range, the pillar-like members can be mounted in the first region with the long axis oriented along the width direction the first region.

Examples of the pillar-like members, especially the nanomembers with the maximum diameter of 1 μm or less include nanotubes, nanowires, nanorods, nanoribbons, whiskers, and the like. Members with semiconductor characteristics may be used when, for example, such nanomembers are disposed in a uniaxial orientation and a first electrode and a second electrode are provided on the both ends thereof to provide an electronic device such as a transistor. Examples of such members include silicon nanowires and the like.

When the anisotropically-shaped members are plate-like members, the shape of the first region provided on the substrate may be decided according to the shape of the plate-like member to be mounted on the first region. In this case, the shape of the first region preferably should correspond to the shape of a predetermined surface of the mounted plate-like member (the surface that meets the substrate face to face when mounted on the substrate). Examples of such a shape include polygonal such as triangle, quadrangle, and pentagonal, and circular and elliptical, etc. In this case, the predetermined surface of the plate-like member preferably should resemble the shape of the first region as closely as possible, and more preferably should be substantially the same as the shape of the first region.

The plate-like member may be a component chip including an electronic device, for example. The electronic device included in the component chip is, for example, a transistor (for example, field-effect transistor), a resistor, a capacitor, an inductor, and the like. The component chip may include only one electronic device or more than one electronic device. The component chip may include a circuit made up of a plurality of electronic devices. The electronic device included in the component chip may be a monocrystalline silicon transistor, or a circuit element with integrated monocrystalline silicon transistors. The longest side of the component chip is 1000 µm or less, for example.

When the electronic device included in the component chip is a field-effect transistor, the substrate on which the component chip is to be mounted may be provided beforehand with an electrode pattern that corresponds to the source electrode, drain electrode, and gate electrode of the transistor, and the component chip may be disposed on this pattern by a mounting method of the present invention. Such transistors may be used as transistors for controlling the pixels of an active-matrix display device, for example.

The plate-like members may be sheet-like semiconductors, for example. In this case, for example, electrodes may be formed that are electrically connected to a sheet-like semiconductor mounted on a substrate, so as to fabricate a field-effect transistor in which the sheet-like semiconductor functions as a channel region.

<Mounting Apparatus>

A mounting apparatus of the present invention is a mounting apparatus for mounting the anisotropically-shaped member on a substrate, and includes: liquid disposing means for disposing the first liquid in the first region provided on one principal surface (A) of the substrate; and transfer means for bringing the anisotropically-shaped member, disposed on one principal surface (B) of the transfer substrate in a predetermined orientation, into contact with the first liquid disposed in the first region.

The liquid disposing means is not limited as long as it includes a mechanism capable of disposing the first liquid on the substrate, i.e., any conventional mechanism used in, for example, an ink-jet method, a method using a dispenser, a screen printing method, and the like. Further, the liquid disposing means may include a mechanism for spraying a mist of the first liquid, or a mechanism for spraying a vapor of the first liquid onto the substrate to cause it to condense on the first region of the substrate. An injector used in the ink-jet method is particularly preferable for its ability to dispose a micro liquid droplet in a predetermined position with an accurately controlled volume. Further, as the liquid disposing means, a mechanism may be included in which a roller and a blade, capable of continuously supplying the first liquid onto the substrate, are used together.

The transfer means includes a mechanism by which the anisotropically-shaped member, disposed on the transfer substrate, can be brought into contact with the first liquid disposed in the first region of the substrate. The transfer means also may include, for example, a mechanism that can hold the transfer substrate in such an orientation that the principal surface (B) of the transfer substrate faces the principal surface (A) of the substrate, and that can move the transfer substrate in directions orthogonal to the principal surface (A) of the substrate. In this case, the transfer substrate is moved relative to the principal surface (A) of the substrate to bring the principal surface (B) into contact with the principal surface (A), so that the anisotropically-shaped member on the principal surface (B) can make contact with the first liquid.

As the transfer means, a roller may be used. In this case, the transfer substrate is used by being provided on a surface of a cylindrical roller, and the transfer substrate on the roller surface is brought into contact with the substrate to transfer the anisotropically-shaped member.

A mounting apparatus of the present invention may further include liquid removing means for removing the first liquid from the principal surface (A) of the substrate. The liquid removing means may include conventional mechanisms that can be used to remove liquid by heating or by creating a reduced pressure, for example.

<Fabrication Method of Electronic Device>

A fabrication method of an electronic device of the present invention is a method for fabricating an electronic device including a substrate, anisotropically-shaped members mounted on the substrate, and a first electrode and a second electrode electrically connected to the anisotropically-shaped members, wherein the fabrication method includes a step of mounting the anisotropically-shaped members on one principal surface of the substrate using a mounting method of the present invention. As the anisotropically-shaped members, pillar-like members such as nanowires, or plate-like members such as sheet-like semiconductors may be used. The first electrode and the second electrode may be formed after mounting the anisotropically-shaped members on the substrate, or may be formed in advance before mounting the anisotropically-shaped members on the substrate.

The electronic device fabricated by the fabrication method is not particularly limited, and may be a transistor. Examples of the transistor include a back-gate field-effect transistor, a top-gate field-effect transistor, and the like.

<Display Device>

A display device of the present invention includes an electronic device fabricated by a fabrication method of an electronic device of the present invention. An examples of a display device of the present invention is a display device including: a substrate; transistors (electronic device) mounted on the substrate; and a first and a second wiring for controlling the transistors. In this display device, the transistors are electrically connected to the first wiring and the second wiring via electrode terminals.

Examples of a display device of the present invention include a liquid crystal display, an organic electroluminescence display, a plasma display, a display employing electrophoresis, a display employing magnetic powder, and the like.

<Electronic Device>

An electronic device of the present invention includes: a substrate having a principal surface provided with a first region and a second region, the second region surrounding the first region and having a lower surface energy than the first region; pillar-like members disposed in the first region in a predetermined orientation; and a first and a second electrode electrically connected to the pillar-like members, wherein the first region is rectangular in shape, and the length of the first region along the width direction is at least 0.8 times to at most 1.5 times the long axis of the pillar-like members, and wherein the pillar-like members are disposed such that the direction along the long axis is along the width direction of the first region. In an electronic device of the present invention, the pillar-like members may be members with semiconductor characteristics, so that the electronic device functions as a semiconductor device. In this case, the electronic device may be a field-effect transistor in which at least of a portion of the pillar-like member functions as a channel region.

First Embodiment

An example of a method and an apparatus for mounting anisotropically-shaped members according to the present invention is described below with reference to the attached drawings. Note that, in the present embodiment, description will be given through the case where the anisotropically-shaped members are pillar-like members.

Figure 3A:
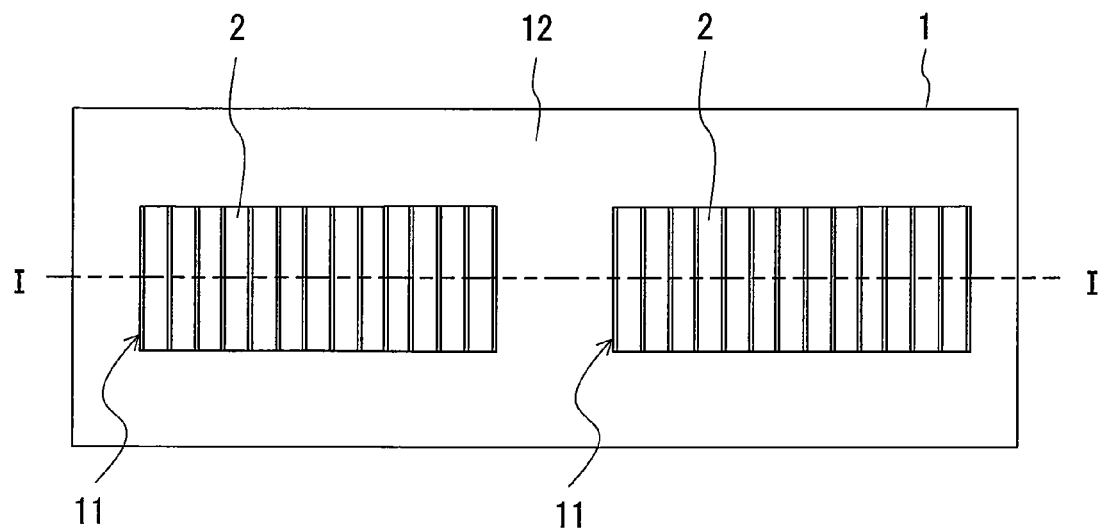
FIG. 3A is a plan view showing pillar-like members mounted by a mounting method of the present invention.
Figure 3B:
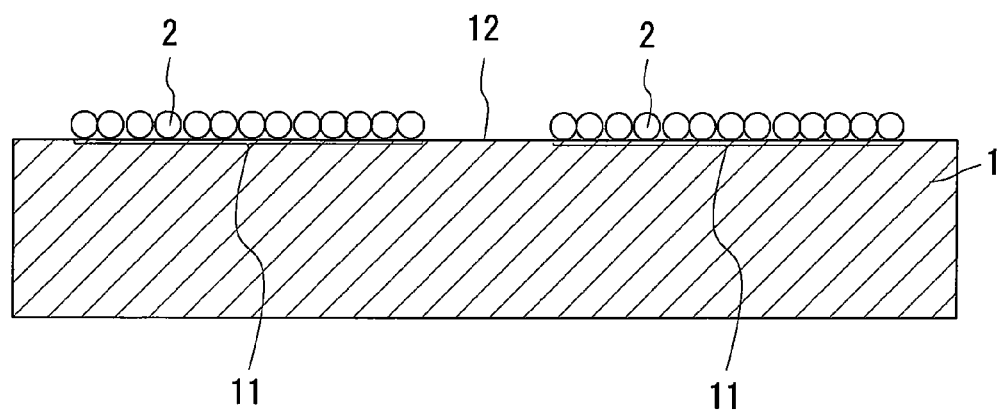
FIG. 3B is a cross sectional view of the illustration shown in FIG. 3A.

FIG. 3A is a plan view illustrating the pillar-like members that have been mounted on a substrate using a mounting method of the present embodiment. FIG. 3B is a cross sectional view taken along the line I-I of FIG. 3A and perpendicular to the substrate. In the present embodiment, pillar-like members 2 are disposed in a plurality of first regions 11 formed on one principal surface of a substrate 1. In the present embodiment, the first regions 11 on the substrate 1 are formed not in contact with each other. The first regions 11 are rectangular in shape, and more than one pillar-like member 2 (thirteen members in the figures) is mounted in each first region 11. In the present embodiment, the first region 11 is formed such that its width direction is substantially equal in length to the long axis of the pillar-like member 2. Thus, the pillar-like members 2 in the first region 11 are mounted in such an orientation that the long axis of the pillar-like members 2 substantially coincides with the width direction of the first region 11. Further, on the principal surface of the substrate 1, a second region 12 is provided surrounding the first regions 11. The second region 12 is formed such that it is less wettable than the first regions 11 with respect to the first liquid (described later) used in the mounting method of the present embodiment. Note that, because water is used as the first liquid in the present embodiment, the first region is provided as a hydrophilic region, and the second region is provided as a water-repelling region. In order to facilitate efficient movement of the pillar-like members to the region of the first liquid, the surface of the pillar-like members is at least partially hydrophilic.

The mounting method of the present embodiment is described below. For convenience, the description will be given based on a method of mounting pillar-like members on a substrate 1 that includes the first region 11 and the second region 12 surrounding the first region 11 on one principal surface, as shown in FIG. 4.

Figure 4:
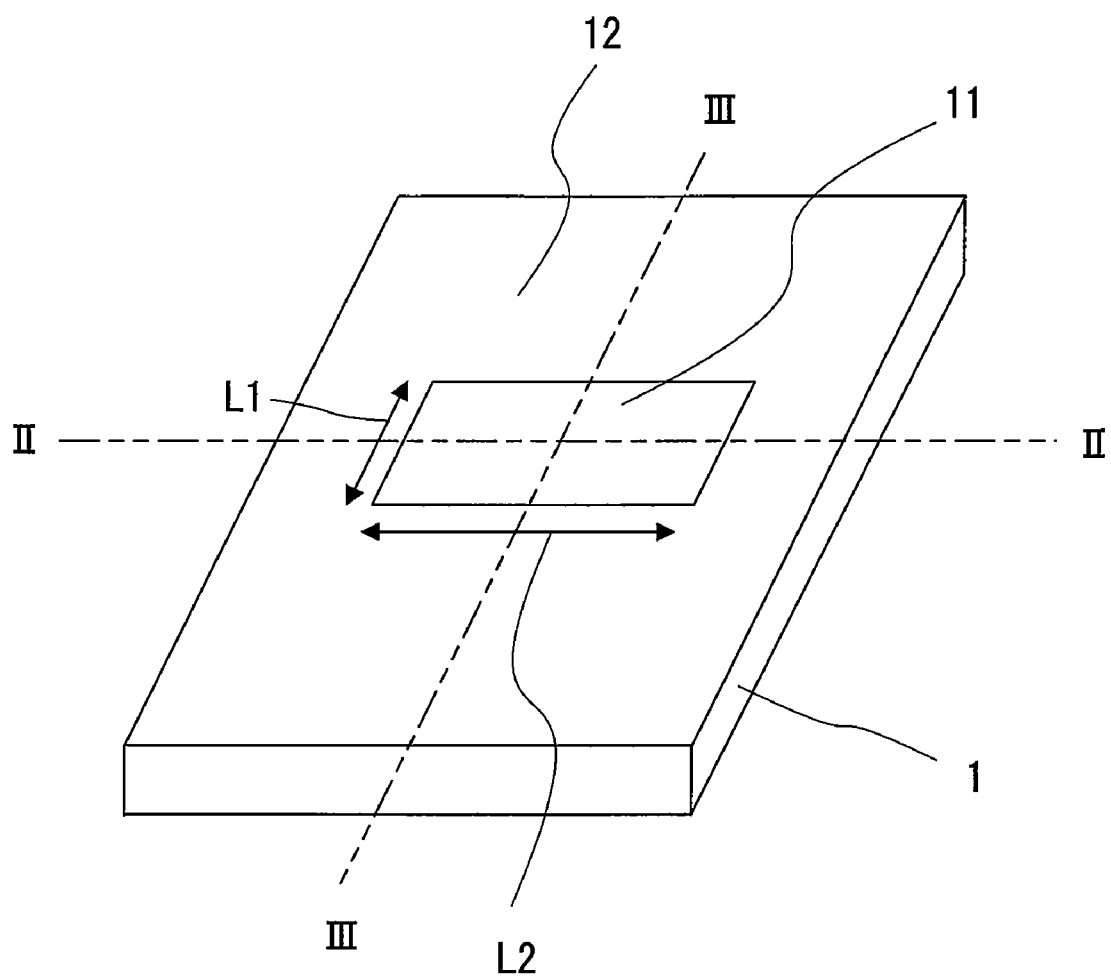
FIG. 4 is a perspective view showing a substrate that has been surface-treated.

FIGS. 1A to 1E are cross sectional views taken along the line II-II of FIG. 4 and perpendicular to the substrate, showing the steps of mounting the members on the substrate using the mounting method of the present embodiment. FIGS. 2A to 2E are cross sectional views taken along the line III-III of FIG. 4 and perpendicular to the substrate, showing the steps of mounting the members on the substrate using the mounting method of the present embodiment.

The substrate 1 shown in FIG. 4 includes the first region 11 and the second region 12 that have been formed on one principal surface of the substrate 1 by a surface treatment. In the present embodiment, the first region 11 is formed such that a length L1 in the width direction is substantially equal to the length of the member along its long axis. For example, when the pillar-like member is a cylindrical nanowire with an average length of 10 μm along its long axis and an average diameter of 0.2 μm, the first region 11 may be, for example, a rectangle with a length L1=10 μm along the width direction and a length L2=30 μm along the longitudinal direction. In this case, one to several ten nanowires are disposed in each first region 11. In the present embodiment, the length L1 along the width direction of the first region 11 is described as being substantially equal to the length along the long axis of the pillar-like member. However, the present invention is not just limited to this example and the length L1 may be longer than the length along the long axis of the pillar-like member.

The nanowires used as the pillar-like members 2 in the present embodiment can be produced from various materials, including metals, semiconductors, insulators, and the like. The nanowires, when made of silicon, can be grown, for example, according to the VLS (Vapor-Liquid-Solid) growth mechanism, using catalyst metal particles by the CVD method. This method allows the particle diameter and growth time of the catalyst metal particles to be controlled, and accordingly nanowires of a uniform diameter and a uniform length can be produced. In air, the surfaces of the nanowires are slightly oxidized and rendered hydrophilic. As the material of the catalyst metal particles used for growing the silicon nanowires, transition metals, such as gold, iron, cobalt, and nickel, or alloys of such transition metals suitably can be used.

Figure 2A:
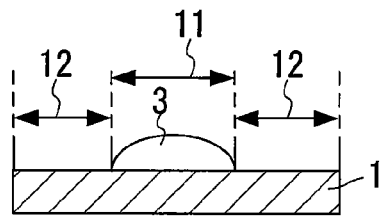
FIG. 2A to FIG. 2E are cross sectional views schematically showing respective steps according to one embodiment of a mounting method of the present invention.

First, as shown in FIG. 1A and FIG. 2A, a first liquid 3 is disposed in the first region 11 of the substrate 1 shown in FIG. 4. In the present embodiment, water is used as the first liquid 3, as noted above. The method of disposing the first liquid 3 is not particularly limited, and a method may be used in which a liquid droplet of the first liquid is brought into contact with the surface of the substrate 1 provided with the first region 11, or a method may be used in which the first liquid is applied using a roller and a blade together, for example. The first region 11 is a hydrophilic region with high wettability to the first liquid (water in this embodiment), and is surrounded by the second region 12, which is water-repelling and less wettable to the first liquid. Thus, the first liquid 3 disposed in the first region 11 stably can stay therein.

Figure 1B:
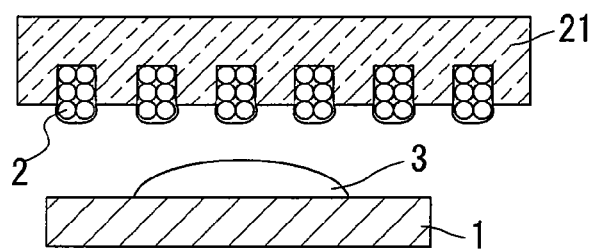
Figure 2B:
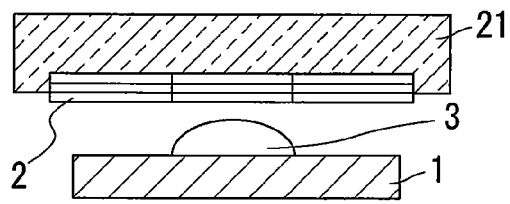

Next, a transfer substrate 21 is prepared that includes the pillar-like members 2 oriented and disposed in one direction on one principal surface. The transfer substrate 21 is positioned such that the surface with the pillar-like members 2 face the first liquid 3 disposed on the substrate 1, as shown in FIG. 1B and FIG. 2B. The surfaces of the pillar-like members 2 are rendered at least partially hydrophilic to provide high wettability with respect to the first liquid 3.

Figure 1C:
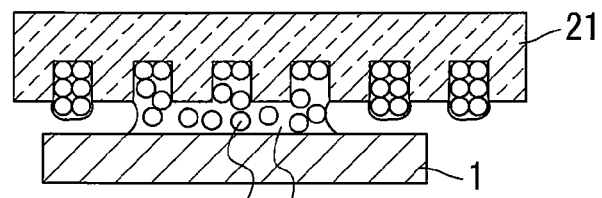
Figure 2C:
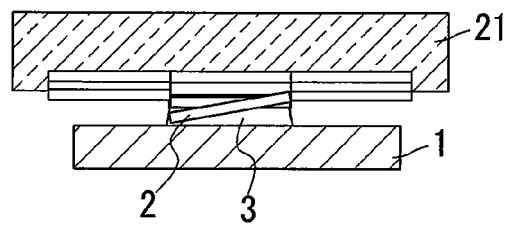

Then, as shown in FIG. 1C and FIG. 2C, the pillar-like members 2 disposed on the transfer substrate 21 are brought into contact with the first liquid 3 trapped in the first region 11 of the substrate 1. As a result, the pillar-like members 2 move to the region of the first liquid 3 and are transferred to the rectangular, first region 11 on the substrate 1. To describe more specifically, the pillar-like members 2 on the surface of the transfer substrate 21 make contact with the first liquid 3 disposed in the first region 11 of the substrate 1, and are drawn into the first liquid 3 by the surface tension of the first liquid 3. As a result, the pillar-like members 2 are transferred to the substrate 1 by maintaining their orientation on the transfer substrate 21.

Figure 1D:
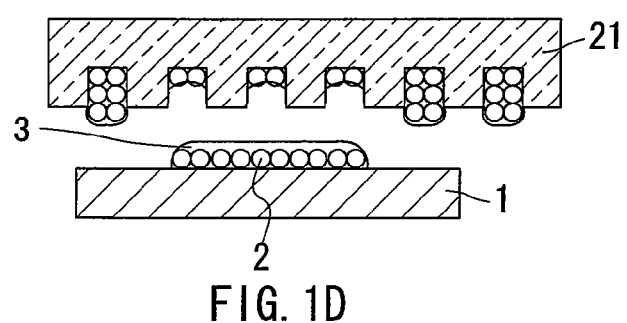
Figure 1E:
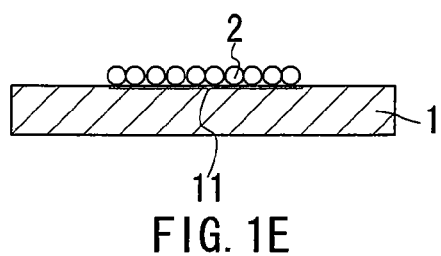
Figure 2D:
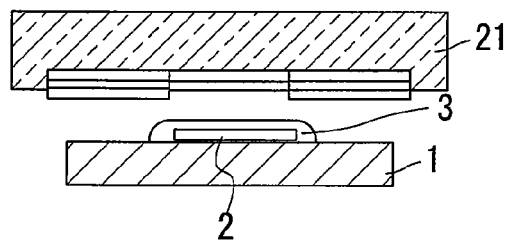
Figure 2E:
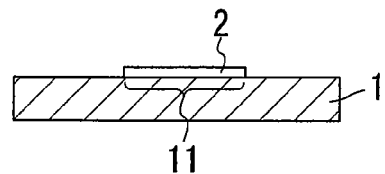

Thereafter, the transfer substrate 21 is separated from the substrate 1. In FIG. 1D and FIG. 2D, the pillar-like members 2 disposed on the surface of the transfer substrate 21 have been drawn into the first liquid 3 on the substrate 1. By subsequently drying and removing the first liquid 3, the pillar-like members 2 are oriented and disposed on the substrate 1, as shown in FIG. 1E and FIG. 2E.

The following will describe an example of a method for forming the first and second regions 11 and 12 on the substrate 1, with reference to FIG. 5A to FIG. 5C. In the present embodiment, description will be given through the case where the substrate 1 is a silicon substrate, and the mounted pillar-like members 2 are nanowires.

The formation of the first region on the silicon substrate proceeds by first rendering the entire surface of the substrate hydrophilic. This is performed by oxidizing the substrate surface by a corona discharge or a plasma process in an atmosphere in the presence of oxygen. The substrate surface may be rendered hydrophilic by depositing a silicon oxide film thereon using a plasma CVD method. Next, as shown in FIG. 5A, rectangular resist films 51 (for example, rectangles each measuring 30 µm in length and 10 µm in width when the mounted nanowires have, for example, an average length of 10 µm along the long axis and an average diameter of 0.2 µm) are formed by a photolithography method in predetermined positions where the nanomembers are to be mounted.

This is followed by formation of a water-repelling region. For example, the water-repelling region may be formed by depositing a water-repellent thin film, such as a silicon nitride film, using a plasma CVD method. Further, the water-repelling region may be formed, for example, by forming an organic monomolecular film having a hydrophilic functional group represented by general formula CxFyHz (where x is an integer of 1 to 10, y is an integer of 1 to 19, and z is an integer that satisfies, for example, $z = 2x-y+1$). In the present embodiment, the substrate 1 with the resist films 51 is immersed in, for example, a toluene solution containing 1 vol % $CF_3(CF_2)_7C_2H_4SiCl_3$, for one hour in a dry atmosphere. The substrate 1 is then washed in toluene and the toluene is removed by drying. As a result, a fluorine-based monomolecular film 52 is formed in a region other than the regions of the resist films 51 as shown in FIG. 5B, so as to provide a water-repelling second region. The resist film 51 is then removed with acetone to provide the substrate 1 including a hydrophilic micro pattern (first regions 11) and the second region 12 surrounding it, as shown in FIG. 5C.

The following will describe an example of a method by which the pillar-like members are disposed on one principal surface of the transfer substrate in a predetermined orientation.

Figure 6:
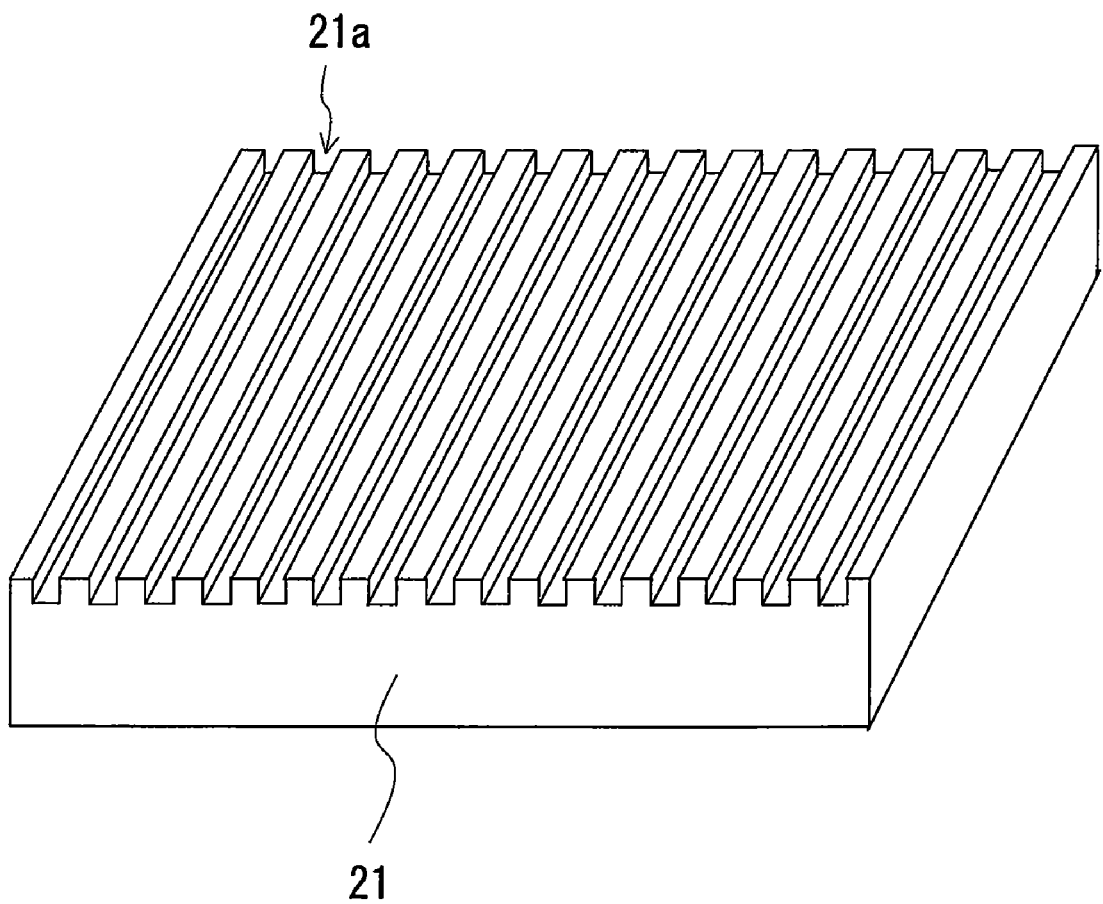
FIG. 6 is a perspective view showing an example of a transfer substrate used in a mounting method of the present invention.

FIG. 6 is a perspective view illustrating the transfer substrate 21 in a state before the pillar-like members are disposed. Grooves 21a are formed on a surface of the transfer substrate 21. The width and depth of the grooves 21a are not particularly limited, and are appropriately set according to, for example, the size (here, the diameter of the nanowires) of the pillar-like members used. For example, when using nanowires having an average diameter of 0.2 µm and an average length of 10 µm, a pattern of micro grooves is formed that has, for example, a groove width of 2 µm, a groove depth of 3 µm, and a groove interval of 2 µm. The nanowires as the pillar-like members are disposed on the transfer substrate 21 having such a pattern of grooves 21a over the entire surface, by orienting the long axis of the nanowires along the grooves 21a. The transfer substrate 21 are fabricated by the steps shown in FIG. 7A to FIG. 7E.

A copper thin film 32 having a thickness of, for example, 3 µm (see FIG. 7B) is formed over a surface of a glass substrate 31 (see FIG. 7A), by high-frequency sputtering. Then, by a photolithography method, a positive resist film 33 having a pattern of grooves having, for example, a groove width of 2 µm and a groove interval of 2 µm is formed (see FIG. 7C).

Figure 7A:
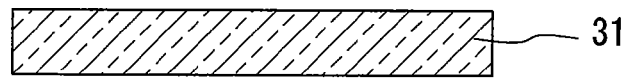
FIG. 7A to FIG. 7E are cross sectional views showing fabrication steps of the transfer substrate used in a mounting method of the present invention.
Figure 7B:
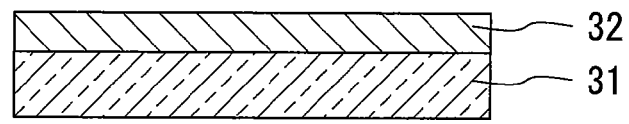
Figure 7C:
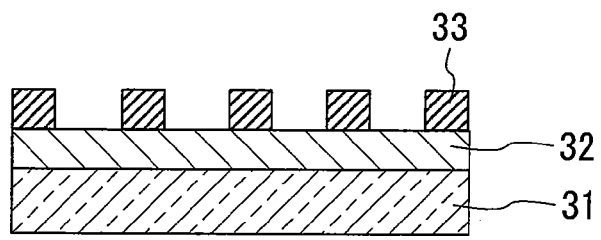
Figure 7D:
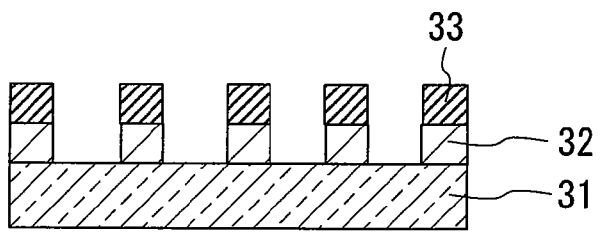
Figure 7E:
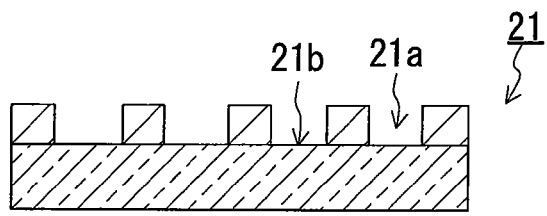

Then, the copper thin film 32 is etched with, for example, a 5 weight % iron chloride ($FeCl_3$) aqueous solution. By thorough washing with deionized water, a groove pattern shown in FIG. 7D is formed in the copper thin film 32. Thereafter, the resist film 33 is removed and the surface of the copper thin film 32 is exposed to an ozone atmosphere for washing. The glass substrate 31 is then immersed in an alcohol solution of $CF_3(CF_2)_7C_2H_4SH$ containing a water-repelling functional group (here, a fluoroalkyl group), and a copper-binding functional group (here, mercapto group), so as to form a water-repelling monomolecular film on the pattern of the copper thin film 32. As a result, the transfer substrate 21 is obtained that is used to orient and dispose the nanowires (see FIG. 7E). Here, the hydrophilic glass substrate is exposed at bottom portions 21b of the grooves 21a formed in the transfer substrate 21.

Figure 8:
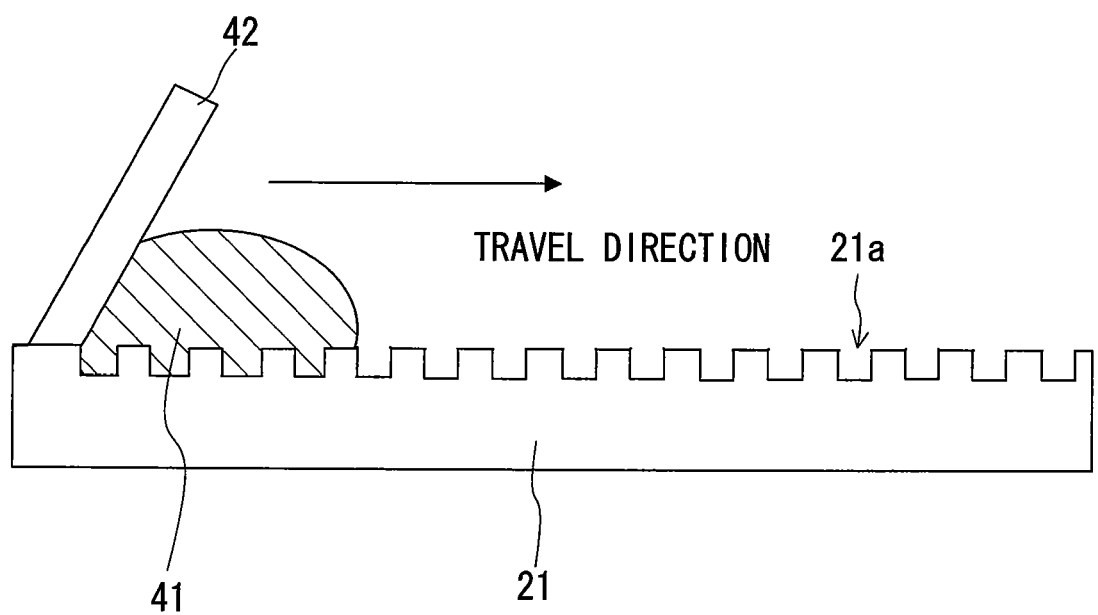
FIG. 8 is a schematic diagram showing how the anisotropically-shaped members are disposed on the transfer substrate.

FIG. 8 illustrates an example of a method for disposing and orienting the nanowires (pillar-like members) over the entire surface of the transfer substrate 21 in one direction. A propyl alcohol solution (second liquid) 41 containing nanowires dispersed therein is placed on the surface of the transfer substrate 21 having the grooves 21a. The solution 41 is then flown over the surface of the transfer substrate 21 using a blade 42, so that the nanowires are disposed in the recessed portions of the grooves 21a by orienting the long axis along the length of the grooves 21a. In this manner, the nanowires as the pillar-like members are disposed over the entire surface of the transfer substrate 21 by being oriented in one direction.

Figure 18A:
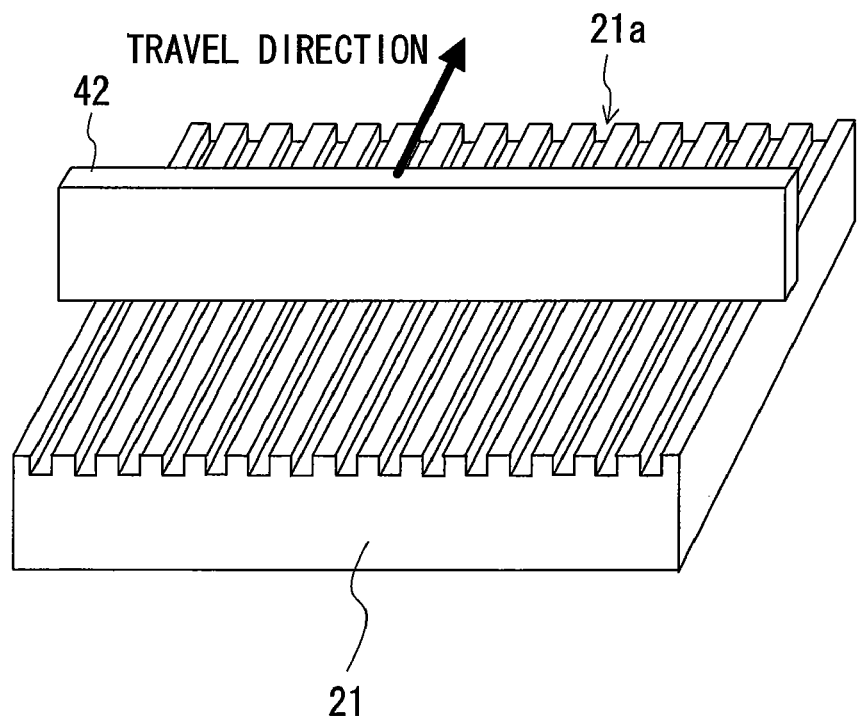
FIG. 18A is a perspective view schematically showing an example of a method for disposing the anisotropically-shaped members on the transfer substrate.
Figure 18B:
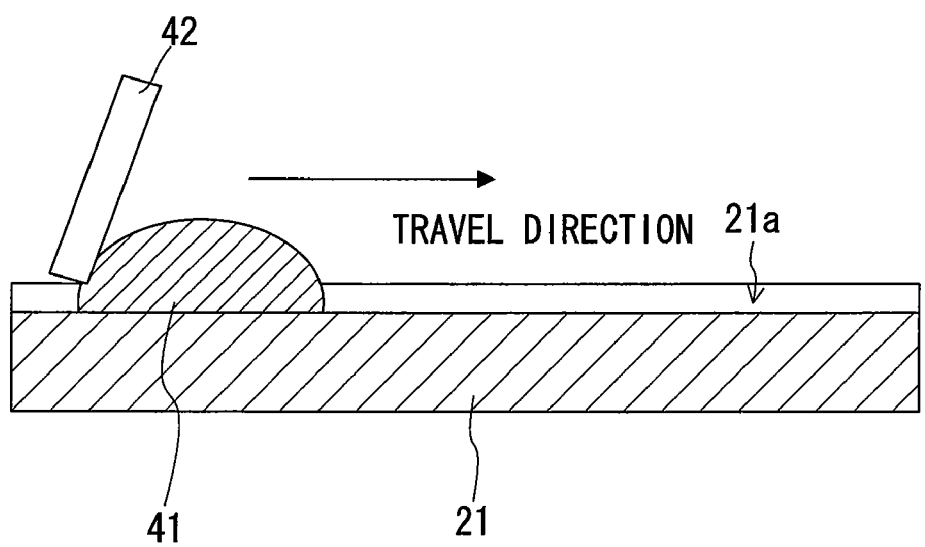
FIG. 18B is a cross sectional view of the illustration shown in FIG. 18A.

FIG. 18A and FIG. 18B show an example of a method that enables the pillar-like members to be more efficiently oriented and disposed on the transfer substrate 21. FIG. 18A is a perspective view showing the direction of travel of the blade when disposing the nanowires on the transfer substrate 21. FIG. 18B is a cross sectional view of the illustration shown in FIG. 18A. In this method, the blade 42 is moved along the direction of extension of the grooves 21a in the transfer substrate 21. That is, the nanowires dispersed in the propyl alcohol solution (second liquid) 41 are flown along the grooves 21a. With this method, the nanowires more efficiently can be disposed in the recessed portion of the grooves 21a by orienting the long axis along the length of the grooves 21a.

The following will describe an example of a mounting apparatus of the present invention.

Figure 9:
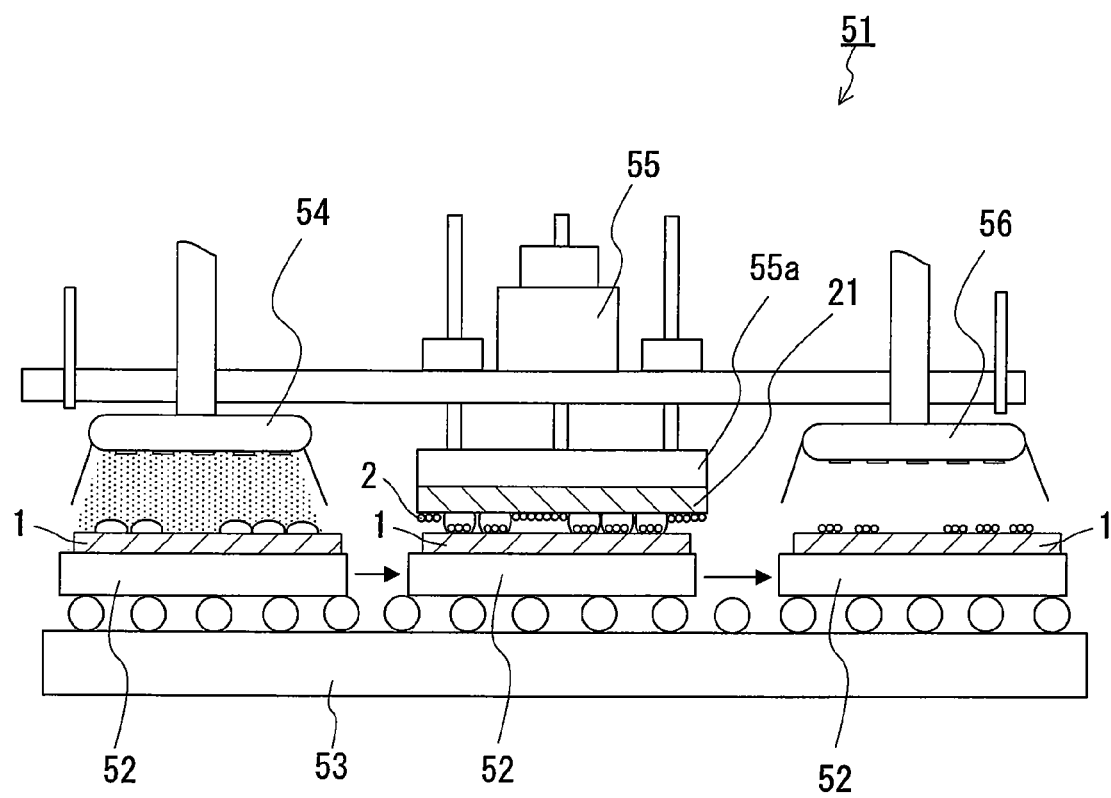
FIG. 9 is a schematic diagram showing an example of a mounting apparatus of the present invention.

FIG. 9 schematically shows a configuration of a mounting apparatus of the present embodiment. A mounting apparatus 51 shown in FIG. 9 is an example of an apparatus used to orient and dispose the pillar-like members, such as the nanowires, on the substrate 1 having the hydrophilic first region and the water-repelling second region.

The mounting apparatus 51 includes: liquid disposing means for disposing the first liquid in the first region provided on one principal surface of the substrate 1; transfer means for bringing the surface of the transfer substrate with the pillar-like members into contact with the first liquid disposed in the first region; and liquid removing means for removing the first liquid. More specifically, the mounting apparatus 51 includes: a transport tray 52 for transporting the substrate 1, placed thereon, to each operation area; a transport mechanism 53 for transporting the transport tray 52 to each operation area; an atomizer (liquid disposing means) 54 for spraying a mist of the first liquid onto the substrate 1; a transfer-substrate moving mechanism (transfer means) 55 for holding the transfer substrate 21 and moving the transfer substrate 21 to bring the surface of the transfer substrate 21 with the pillar-like members 2 into contact with the substrate 1; and a drying mechanism (liquid removing means) 56 for drying the first liquid on the substrate 1. In this embodiment, transport rollers are used as the transport mechanism 53, for example. The transport tray 52 placed on the transport rollers is moved to each operation area by the rotation of the transport rollers. As the transfer-substrate moving mechanism 55, a device capable of press-driving (press-drive device) can be used, for example. In this embodiment, a pressing device equipped with a precise vertical driving mechanism is used, for example. The transfer substrate 21 is set to a slide plate 55a capable of vertical movement, and the slide plate 55a is lowered to bring the transfer substrate 21 into contact with the surface of the substrate 1 on the transport tray 52, so as to transfer the pillar-like members 2 to the substrate 1. As the drying mechanism 56, a blowing device is used that blows dry air, for example. It should be noted here that the apparatus shown in FIG. 9 is merely an example, and a mounting apparatus of the present invention is not limited thereto.

In the apparatus 51, the substrate 1, placed on the transport tray 52, is transported to each operation area by the transport mechanism 53. The substrate 1 is first transported to the area of the atomizer 54, and a mist of heated water as the first liquid is sprayed onto the surface provided with the first regions. By this operation, micro droplets of water are evenly disposed in each first region. The substrate 1 with the water disposed thereon is transported to the area of the transfer-substrate moving mechanism 55, where the water vapor humidity is 100%. The transfer substrate 21 has been set to the transfer-substrate moving mechanism 55 such that the surface on which the pillar-like members 2 are disposed in a particular orientation faces the substrate 1. The pillar-like members are transferred to each first region of the substrate 1 by maintaining the orientation, as a result of the vertical movement of the mechanism 55, which vertically moves the slide plate 55a relative to the surface of the substrate 1 on which the first liquid is disposed. Then, the transport mechanism 53 moves the substrate 1 to the area of the drying mechanism 56, where the water (first liquid) is evaporated. As the water evaporates, the pillar-like members 2 are mounted on the substrate 1 with their orientation regulated and maintained in the first region.

The following will describe another example of a mounting apparatus of the present invention.

FIG. 19A schematically illustrates an example of a mounting apparatus of the present invention. A mounting apparatus 191 includes a water roller (liquid disposing means) 192 for disposing a first liquid (water in this example) 3 in the first regions provided on one principal surface of the substrate 1, and a transfer roller (transfer means) 194 configured to include a blanket 193 around its surface. The blanket 193 is a cylindrical structure provided as a transfer substrate. The mounting apparatus 191 further includes: a member supply roller 196 for supplying a second liquid 195 containing the pillar-like members 2 dispersed therein to the surface of the blanket 193; a dispenser 197 for supplying the second liquid 195 containing the pillar-like members 2 dispersed therein to the member supply roller 196; a blade 198 for regulating the amount of the second liquid (containing the pillar-like members 2) 195 on the surface of the blanket 193; a blade 199 for regulating the amount of the first liquid 3 in the first regions; and transport rollers 200 for transporting the substrate 1. In order to easily supply the pillar-like members 2 to the blanket 193, the second liquid 195 may be supplied to the surface of the blanket 193 using a roller or the like, prior to supplying the pillar-like members 2 to the blanket 193.

FIG. 19B is a plan view showing a portion of the surface of the blanket 193. The surface of the blanket 193 includes grooves 193a formed in stripes and extending substantially parallel to the direction of rotation of the blanket (extending along the peripheral direction of the transfer roller 194). In FIG. 19B, the grooves 193a are hatched for illustration purpose. As shown in FIG. 19A, the member supply roller 196 supplies (flows) the second liquid 195 containing the pillar-like members 2 to the surface of the blanket 193 along the grooves 193a. This enables the pillar-like members 2 to be efficiently disposed in the recessed portion of the grooves 193a with the long axis oriented along the length of the grooves 193a. FIG. 19C is a perspective view showing a portion of the substrate 1. In FIG. 19C, the first regions 11 are hatched for illustrative purpose.

An example of a mounting method using the mounting apparatus 191 is described below with reference to FIG. 19A to FIG. 19C. The member supply roller 196 supplies the pillar-like members 2 to the surface of the blanket 193. Here, the second liquid 195 may be supplied together with the pillar-like members 2. On the surface of the blanket 193, the pillar-like members 2 are oriented with the long axis substantially parallel to the grooves 193a. The blanket 193, holding the pillar-like members 2 on the surface, is rotated by the transfer roller 194 so that the pillar-like members 2 move to the transfer area (contact area with the first liquid 3 on the substrate 1). Meanwhile, the substrate 1 with the first regions 11 is transported to the transfer area by the transport rollers 200. As the substrate 1 is transported to the transfer area, the first liquid 3 is disposed on the first regions 11 by the water roller 192 provided on the upstream side of the transfer area in the direction of transport of the substrate 1. As the blanket 193 contacts the first liquid 3 at the transfer area, the pillar-like members 2 on the blanket 193 are brought into contact with the first liquid 3, and as a result move to the region of the first liquid 3. The first liquid 3 is subsequently removed by natural drying, and the pillar-like members 2 are disposed in the first regions 11 by being oriented. In this manner, with the mounting apparatus 191 employing a roll-to-roll method, the pillar-like members efficiently can be disposed in a predetermined region.

As described herein, the first liquid is removed by natural drying. However, the invention is not limited to this example, and a dryer or the like may be separately provided as a mechanism (liquid removing section) for removing the liquid.

As described above, with the mounting method and the mounting apparatus of the present embodiment, the pillar-like members can be disposed on the substrate in a predetermined orientation. In the present embodiment, water is used as the first liquid. However, the invention is not limited to this example, and alcohols such as methanol, ethanol, ethylene glycol, and glycerine, or a mixture of such alcohol and water can be used as well.

Second Embodiment

The following will describe an example of a method and an apparatus for mounting the anisotropically-shaped members, with reference to the accompanying drawings. The description of this embodiment will be given through the case where the anisotropically-shaped members are plate-like members.

Examples of the plate-like members are sheet-like semiconductors, or component chips including an electronic device such as a transistor. In the following, description will be given through the case where the plate-like members are component chips that themselves serve as transistors.

Figure 10:
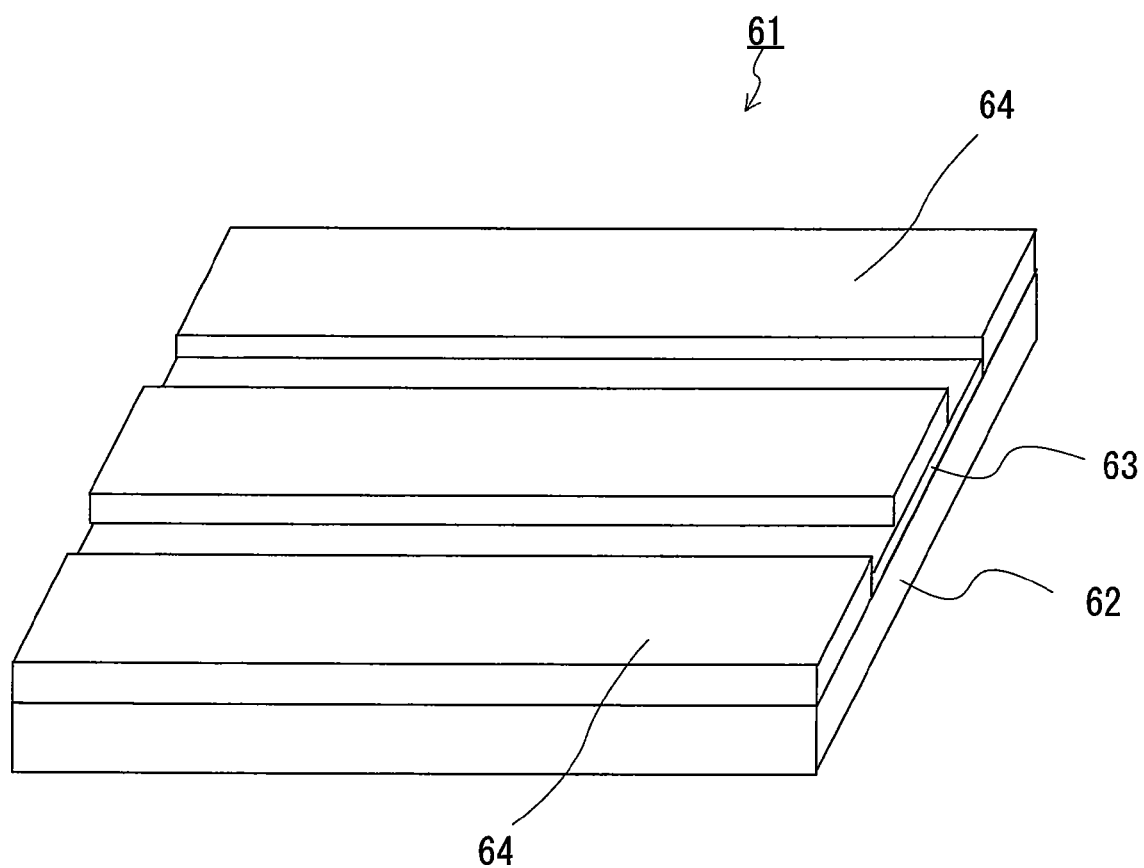
FIG. 10 is a perspective view showing an example of a plate-like member.

FIG. 10 is a perspective view of a plate-like member 61 of the present embodiment. The plate-like member 61 includes a semiconductor silicon substrate 62, electrodes 64 made of nickel, and an insulating film 63. The electrodes 64 and the insulating film 63 are formed on the semiconductor silicon substrate 62. The plate-like member 61 also includes a gate electrode 65 formed on the insulating film 63. The plate-like member 61 has a length of 10 μm, a width of 30 μm, and an overall thickness of 4 μm. The plate-like member 61 itself constitutes an electronic device, i.e., a FET with the two electrodes 64 serving as the source electrode and the drain electrode, respectively.

Figure 11A:
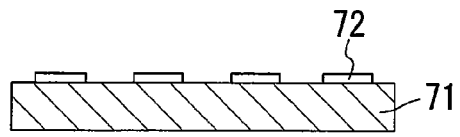
FIG. 11A to FIG. 11G are cross sectional views schematically showing respective steps in an example of a fabrication method of the plate-like member.
Figure 11B:
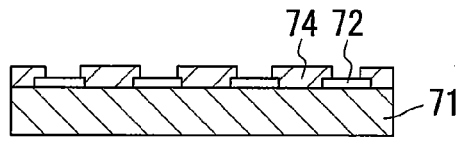
Figure 11C:
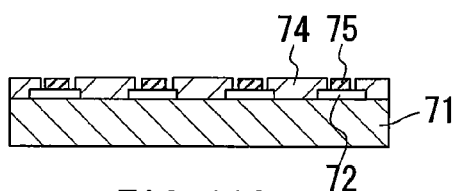
Figure 11D:
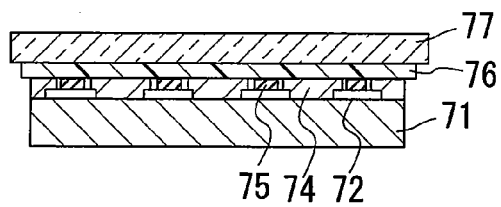
Figure 11E:
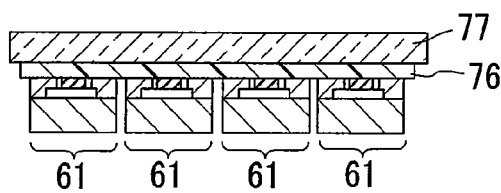
Figure 11F:
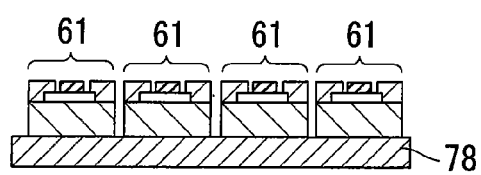

FIG. 11A to FIG. 11G show a fabrication method of the plate-like member 61. First, a semiconductor silicon wafer 71 is prepared, and an insulating film 72 formed of a silicon oxide film is formed by plasma CVD. The insulating film 72 is then patterned by a pattern etching process (FIG. 11A). Thereafter, an electrode film 74 made of nickel is patterned (FIG. 11B). Next, an electrode film 75 made of platinum is formed on the pattern of the insulating film 72 (FIG. 11C). Then, the wafer 71 with the electrode films 74 and 75 is bonded to a glass support substrate 77 using a thermoplastic wax 76 (FIG. 11D). On the support substrate 77, the rear surface of the wafer 71 is polished by a CMP device (chemical mechanical polishing device) to reduce thickness. Then, as shown in FIG. 11E, the wafer 71 is cut from the rear surface into individual pieces (plate-like members 61) using a precise dicing saw device (FIG. 11E). After thoroughly washing the polished surface of each plate-like member 61 (rear surface of the semiconductor silicon substrate 62), the plate-like members 61 are placed on a tray 78 with the polished surfaces facing the tray 78, are heated on the tray 78 to soften the thermoplastic wax 76 and detach the support substrate 77 from the plate-like members 61 (FIG. 11F). As a result, a plurality of the plate-like members 61 are obtained.

Figure 11G:
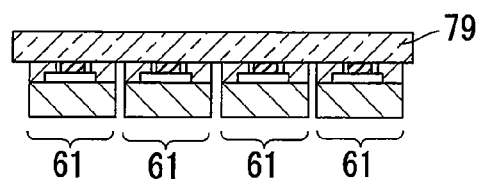

The plate-like members 61 are then transferred to a transfer substrate 79 by maintaining the alignment, using an alcohol-based liquid. As a result, the plate-like members 61 are disposed on the transfer substrate 79 in a predetermined orientation (FIG. 11G).

As a mounting apparatus of this embodiment, the mounting apparatus described in the First Embodiment can be used (see FIG. 9). In this case, the same mounting apparatus as that shown in FIG. 9 can be used by using the transfer substrate 79 (FIG. 11G) instead of the transfer substrate 21.

When the plate-like members are sheet-like semiconductors, the sheet-like semiconductors, having been shaped in a predetermined form, are disposed on the transfer substrate in a predetermined orientation. In this way, the sheet-like semiconductors similarly can be mounted in a predetermined region of the substrate in a predetermined orientation by using the same mounting method and the same mounting apparatus.

Third Embodiment

In the Third Embodiment, one example of an electronic device and a fabrication method of the electronic device of the present invention is described. The description of the present embodiment will be given through the case where the electronic device is a back-gate FET.

Figure 12A:
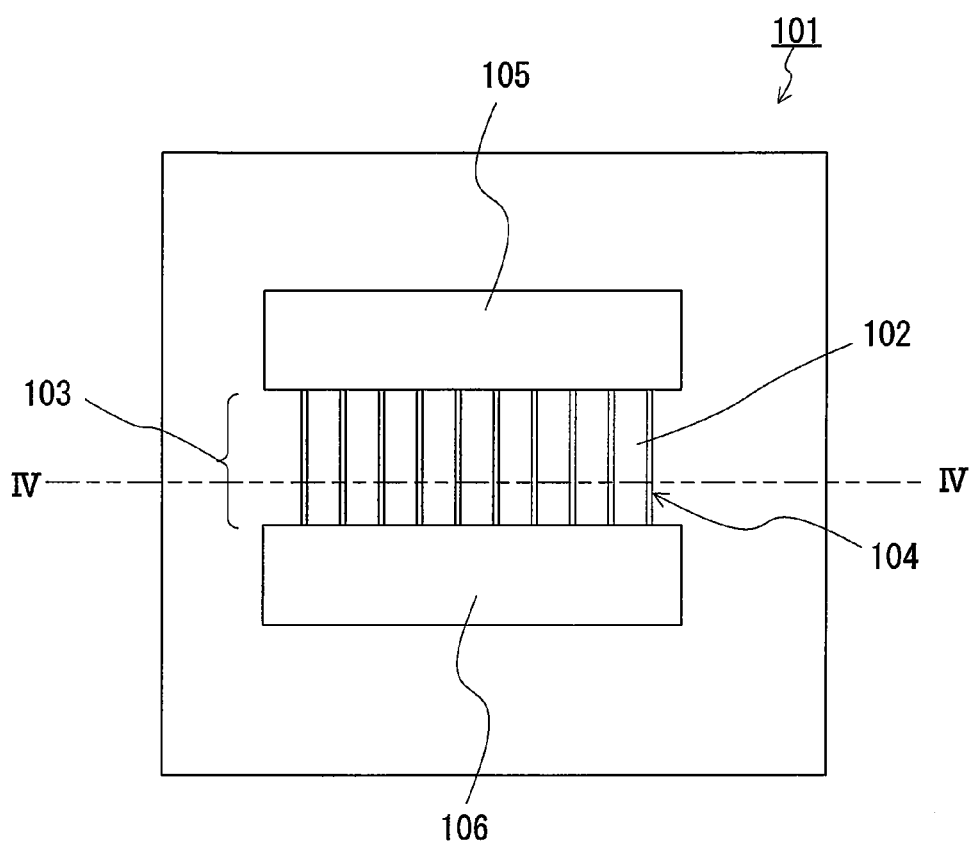
FIG. 12A is a plan view schematically showing a configuration of a back-gate field-effect transistor.
Figure 12B:
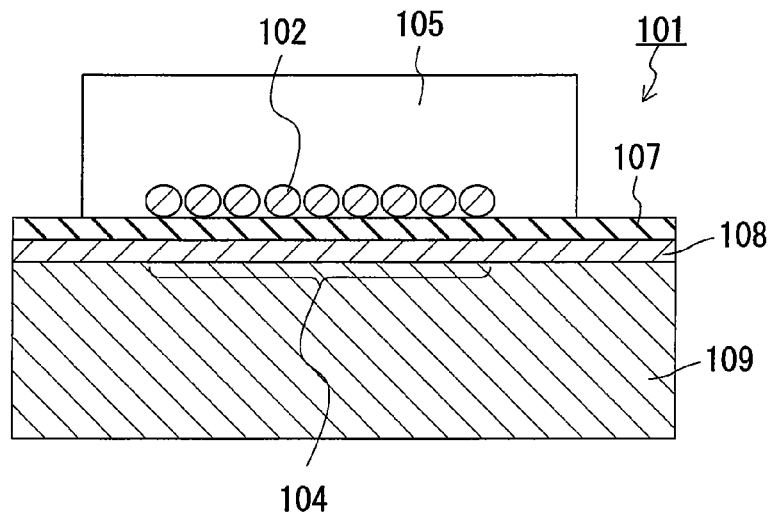
FIG. 12B is a cross sectional view of the back-gate field-effect transistor shown in FIG. 12A.

FIG. 12A is a schematic plan view of a back-gate FET of the present embodiment. FIG. 12B is a cross sectional view taken along the line IV-IV of FIG. 12A and perpendicular to the substrate. A FET 101 of the present embodiment is a device prepared by mounting the pillar-like members on a substrate according to the method described in the First Embodiment. Here, silicon nanowires having semiconductor characteristics are used as the pillar-like members.

As shown in FIGS. 12A and 12B, the FET 101 of the present embodiment includes a channel region 103 having a bundle of silicon nanowires 102 through which carriers (electrons or holes) propagate. The silicon nanowires 102 are disposed in a first region 104, and are connected to a source electrode 105 and a drain electrode 106 (a first electrode and a second electrode, respectively). The source electrode 105 and the drain electrode 106 are provided on a gate insulating film 107, beneath which is disposed a gate electrode 108. The gate electrode 108 is formed on a silicon substrate 109. In the FET 101 having such a configuration, the transistor can be operated by controlling the conductivity of the channel region 103, which is achieved by raising and lowering the potential of the gate electrode 108 using a driving circuit (not shown).

Figure 13A:
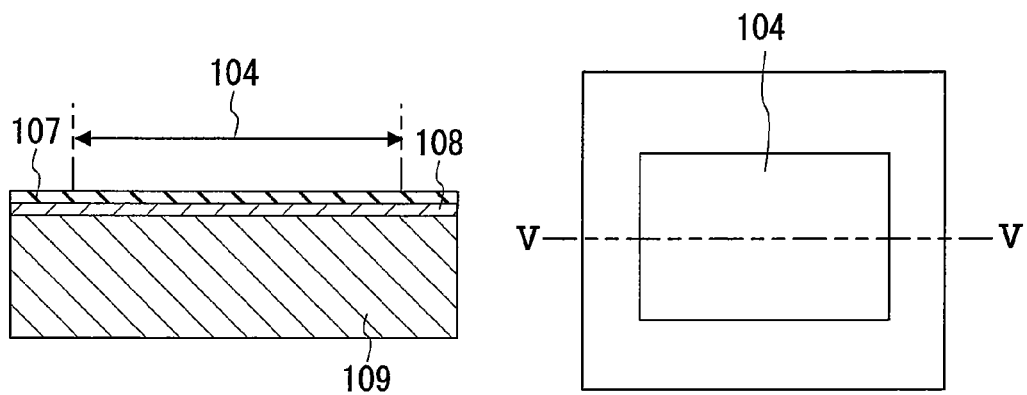
FIG. 13A to FIG. 13C are cross sectional views and plan views showing fabrication steps of the back-gate field-effect transistor shown in FIG. 12A and FIG. 12B.
Figure 13B:
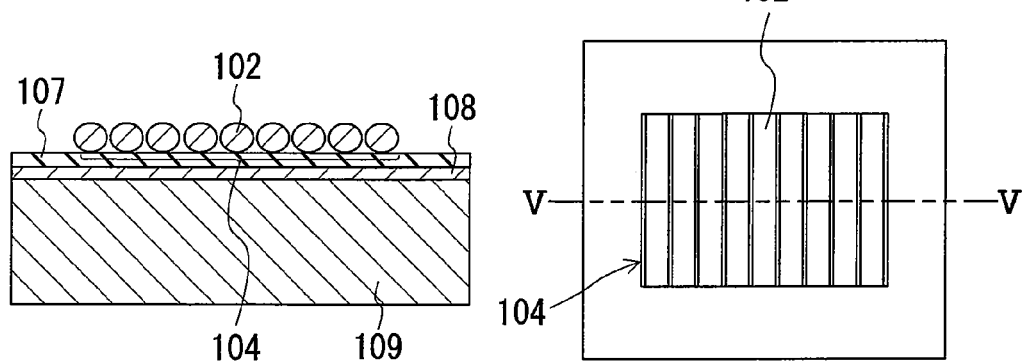
Figure 13C:
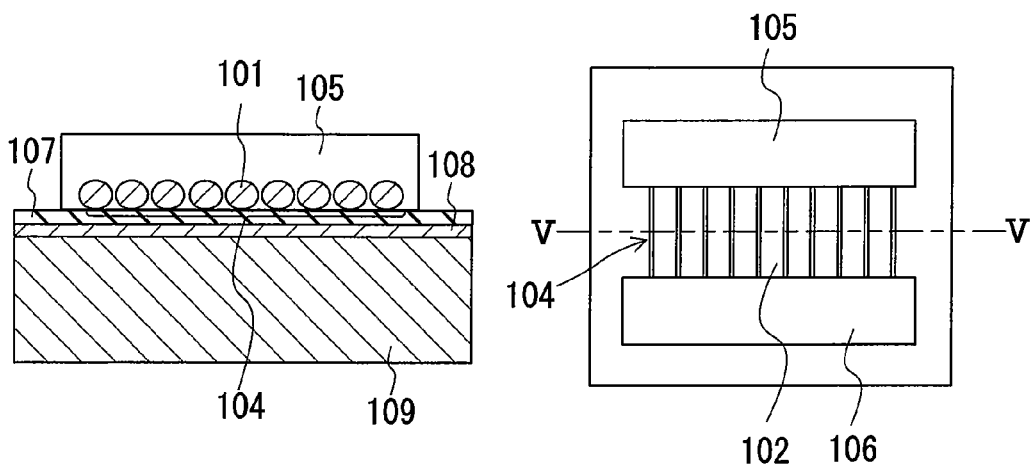

Next, a fabrication method of the back-gate FET 101 is described with reference to FIG. 13A to FIG. 13C. FIG. 13A to FIG. 13C are plan views, and cross sectional views taken along the line V-V, depicting steps in the fabrication method of the present embodiment. Each of FIG. 13A to FIG. 13C shows fabrication of only one transistor. However, in actual practice, large numbers of transistors having the foregoing configuration are formed on the substrate.

As shown in FIG. 13A, a gate insulating film 107 made of silicon oxide is deposited on a silicon film (gate electrode 108) that has been formed by doping the surface of the silicon substrate 109 with p-type impurities. On the gate insulating film 107, the liquid-attracting first region 104 and a second region surrounding the first region 104 are formed. These regions can be formed according to the method described in the First Embodiment. The first region 104 is rectangular in shape, and its size is determined according to the shape of the silicon nanowires mounted on the substrate. In the present embodiment, the first region 104 is shaped such that the length along the width direction is substantially the same as the length of the long axis of the silicon nanowires.

Then, by the transfer mounting method described in the First Embodiment, the silicon nanowires 102 are disposed in such an orientation that the long axis of the silicon nanowires 102 is along the width direction of the first region 104.

Thereafter, as shown in FIG. 13C, the source electrode 105 and the drain electrode 106 are formed on the gate insulating film 107. The electrodes 105 and 106 are formed so as to be electrically connected to the silicon nanowires 102 disposed. The material of these electrodes is preferably silicide that has been prepared from metals, for example, such as titanium, gold, platinum, cobalt, and nickel.

Figure 14A:
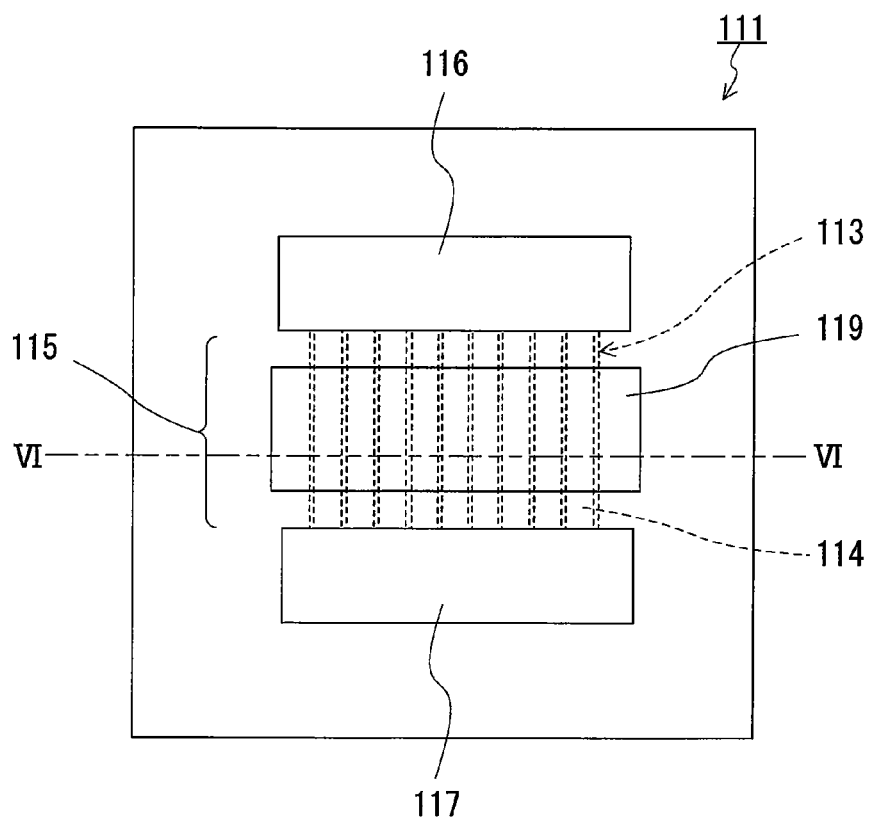
FIG. 14A is a plan view schematically showing a configuration of a top-gate field-effect transistor.
Figure 14B:
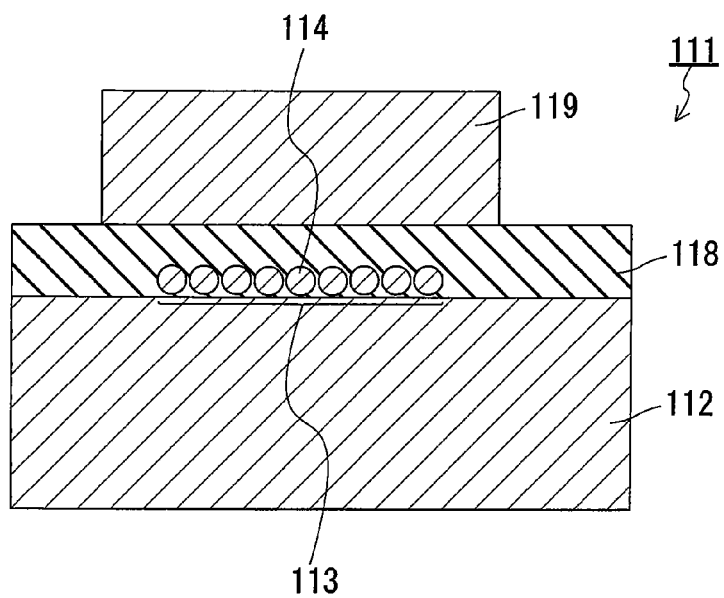
FIG. 14B is a cross sectional view of the top-gate field-effect transistor shown in FIG. 14A.

The electronic device fabricated in the present embodiment may be a top-gate FET described below. FIG. 14A is a schematic plan view of a top-gate FET 111. FIG. 14B is a cross sectional view taken along the line VI-VI of FIG. 14A and perpendicular to the substrate. In the top-gate FET 111, a bundle of silicon nanowires 114 is disposed in a liquid-attracting first region 113 that has been provided on a silicon substrate 112, and this bundle of silicon nanowires 114 constitutes a channel region 115. A source electrode 116 and a drain electrode 117 are electrically connected to the silicon nanowires 114. A gate insulating film 118 is provided on the silicon nanowires 114, and a gate electrode 119 is provided on the gate insulating film 118. In the FET 111 having this configuration, as in the FET 101 shown in FIGS. 12A and 12B, the transistor can be operated by controlling the conductivity of the channel region 115, which can be achieved by raising and lowering the potential of the gate electrode 119 using a driving circuit (not shown).

A fabrication method of the top-gate FET 111 is described below with reference to FIG. 15A to FIG. 15E. FIGS. 15A to 15E are plan views, and cross sectional views taken along the line VII-VII, depicting steps in the fabrication method of the present embodiment.

First, as shown in FIG. 16A, the liquid-attracting first region 113, rectangular in shape and surrounded by the liquid-repelling second region is formed on the surface of the silicon substrate 112. These regions can be formed in the shapes and by the method described in conjunction with the back-gate FET.

Figure 15A:
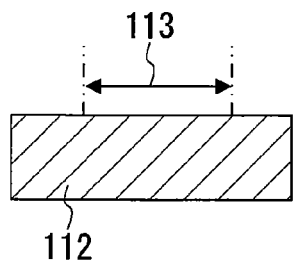
FIG. 15A to FIG. 15E are cross sectional views and plan views showing fabrication steps of the top-gate field-effect transistor shown in FIG. 14A and FIG. 14B.
Figure 15A:
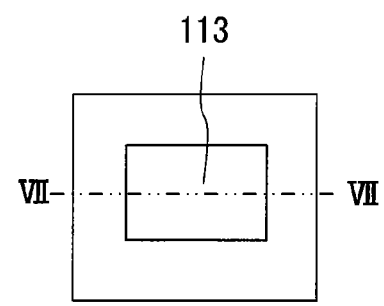
Figure 15B:
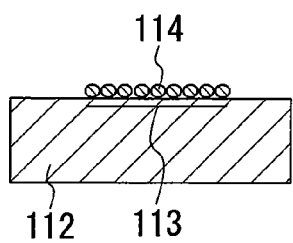
Figure 15B:
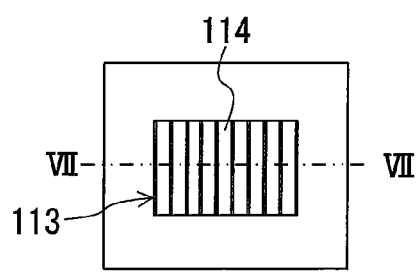

Next, as shown in FIG. 15B, the silicon nanowires 114 are disposed in the first region 113. The silicon nanowires 114 can be disposed by the same method used in the back-gate field-effect transistor.

Figure 15C:
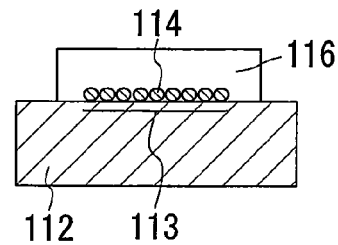
Figure 15C:
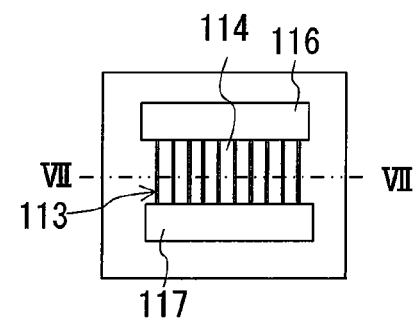

Then, as shown in FIG. 15C, the source electrode 116 and the drain electrode 117 (a first electrode and a second electrode, respectively) are formed that are electrically connected to the silicon nanowires 114.

Figure 15D:
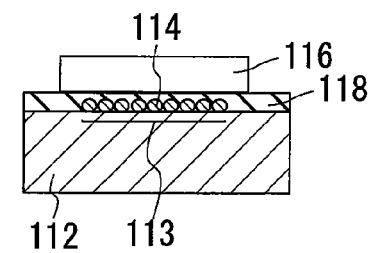
Figure 15D:
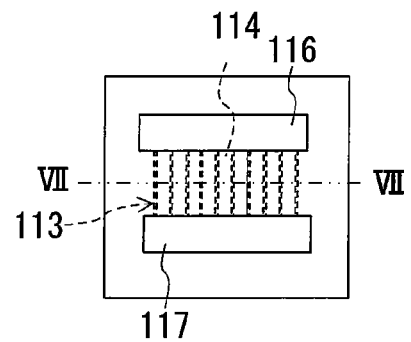

Next, as shown in FIG. 15D, the gate insulating film 118 is formed on the surface other than the regions where the electrodes 116 and 117 are provided.

Figure 15E:
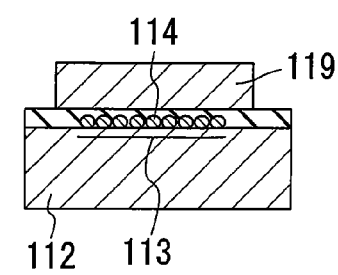
Figure 15E:
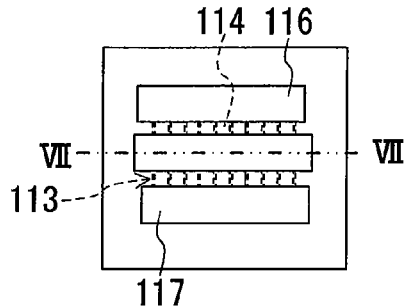

Then, as shown in FIG. 15E, the gate electrode 119 is formed on the gate insulating film 118.

The top-gate FET 111 can be fabricated by the method described above. The materials of the source electrode 116, the drain electrode 117, and the gate electrode 119, as in the case of the back-gate FET, are preferably silicide that has been prepared from metals, for example, such as titanium, gold, platinum, cobalt, and nickel.

Fourth Embodiment

Figure 16:
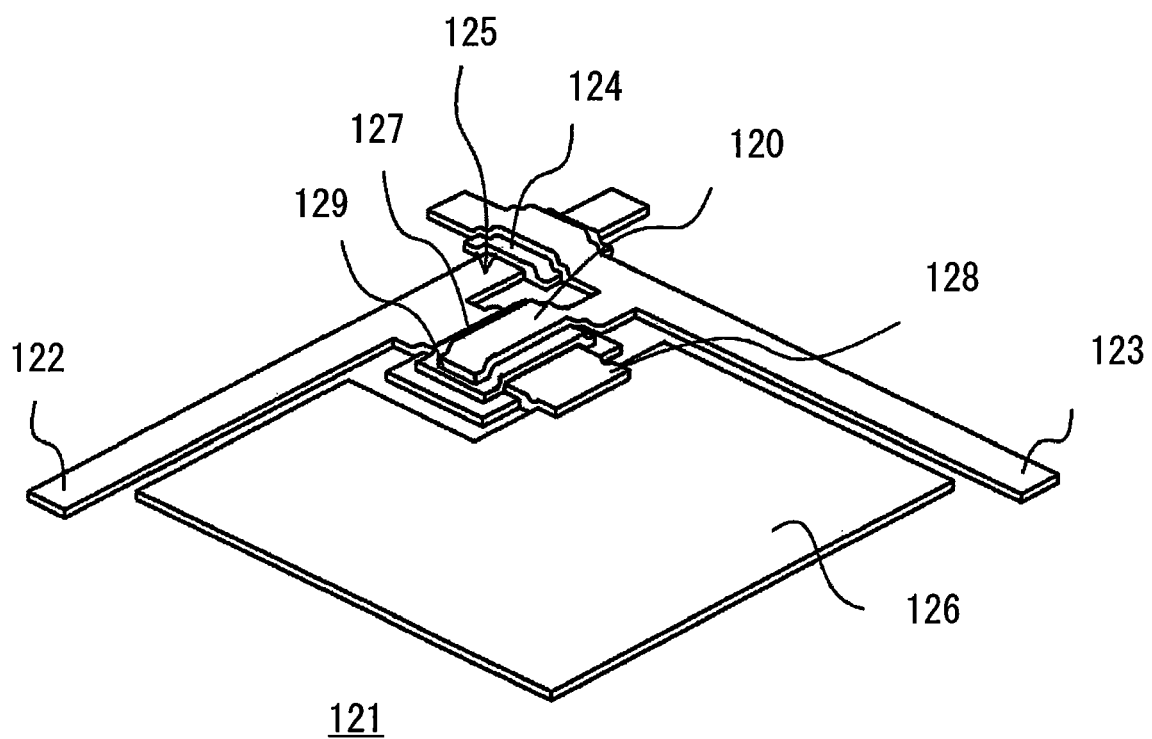
FIG. 16 is a perspective view showing a circuit structure for driving TFTs.

The transistor described in the Third Embodiment can be used as a thin film transistor (TFT) used in display devices and the like. FIG. 16 is a diagram depicting a circuit structure for driving a TFT of a display device, when the TFT is a transistor using the pillar-like members that have been disposed in a predetermined orientation. In the circuit structure shown in FIG. 16, a source electrode line 122 and a gate electrode line 123 are provided on a substrate 121, orthogonally intersecting with each other via a gate insulating film 124. In each region compartmentalized by the source electrode line 122 and the gate electrode line 123, a TFT 125 and a pixel electrode 126 are provided. The TFT 125 includes a source electrode 127 connected to the source electrode line 122, a drain electrode 128 connected to the pixel electrode 126, a gate insulating film 129 provided between the source electrode 127 and the drain electrode 128, and a gate electrode 130 provided on the gate insulating film 129 and connected to the gate electrode line 123. Though not shown in FIG. 16, the nanowires are provided beneath or inside the gate insulating film 129, connecting the source electrode 127 and the drain electrode 128.

When a mounting method of the present invention is used to mount the pillar-like members on the substrate, a flexible substrate may be used as the substrate. Thus, a mounting method of the present invention advantageously can be used for the fabrication of the TFT as shown in FIG. 16. The TFT shown in FIG. 16 can be used for a display panel (display device) as shown in FIG. 17.

Figure 17:
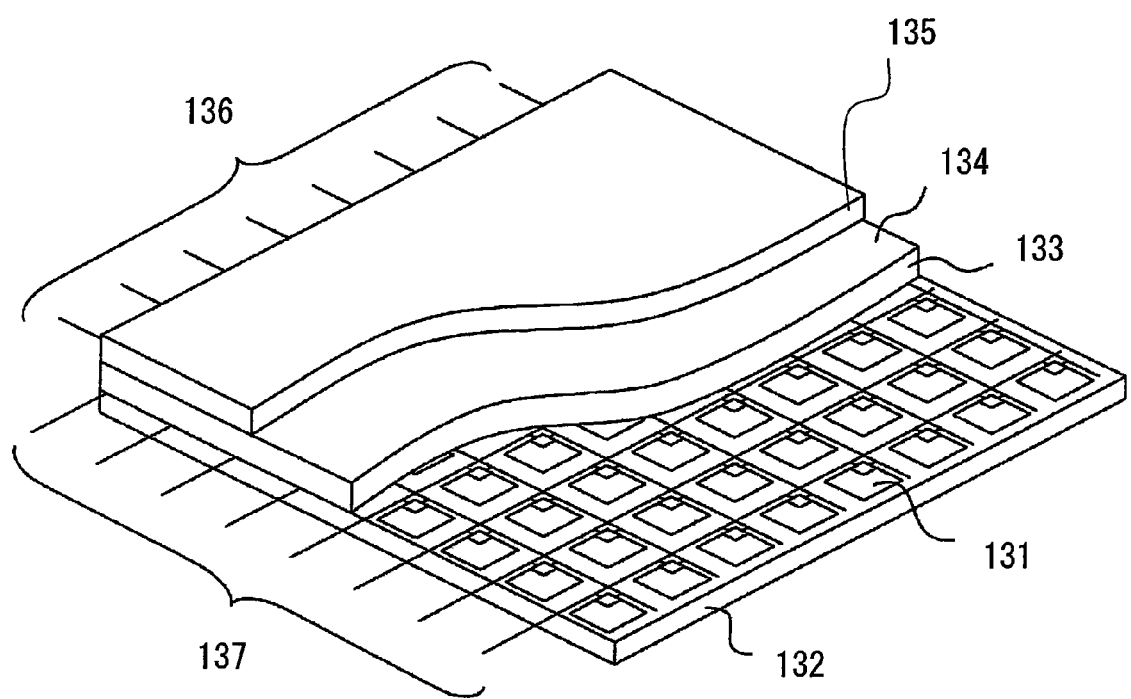
FIG. 17 is a perspective view showing a configuration of an organic EL display as one embodiment of a display device of the present invention.

FIG. 17 is a perspective view illustrating a panel configuration of an organic EL display using the TFT shown in FIG. 16. In the configuration shown in FIG. 17, there are provided a plastic substrate 132 on which TFTs 131 are disposed in a matrix, an organic EL layer 133 provided on the plastic substrate 132, a transparent electrode 134 provided on the organic EL layer 133, and a protective film 135 provided on the transparent electrode 134. The TFTs 131 are connected to gate electrode lines 136 and source electrode lines 137.

A method for mounting anisotropically-shaped members of the present invention can be used to dispose anisotropically-shaped members, including pillar-like members such as the nanowires, on a substrate in a predetermined orientation.

The mounting method can be used to fabricate electronic devices, for example, such as transistors at low cost and in an industrial scale. The method is therefore applicable to not only display devices but fabrication of all-purpose semiconductor devices on inexpensive resin substrates, such as gas sensors and bio-sensors utilizing semiconductor characteristics. Further, when members having conductive metal properties are used as the pillar-like members, the method of the present invention can be used to produce all-purpose electrical wirings. Further, with the ability to dispose plate-like semiconductor devices such as micro scale FETs in a predetermined orientation, the mounting method of the present invention is applicable to fabrication of a TFT driving circuit for display devices, among others.

As many apparently widely different examples of this invention may be made without departing from the spirit and scope thereof, it is to be understood that the invention is not limited to the specific examples thereof except as defined in the appended claims.

What is claimed is:

1. A method for mounting an anisotropically-shaped member on a substrate, comprising the steps of:
    (I) disposing a first liquid in a first region provided on one principal surface (A) of the substrate;
    (II) bringing the anisotropically-shaped member, disposed on one principal surface (B) of a transfer substrate in a predetermined orientation, into contact with the first liquid disposed in the first region, so as to move the anisotropically-shaped member to a region of the first liquid; and
    (III) removing the first liquid from the principal surface (A).

2. The method according to claim 1, wherein the principal surface (A) includes a second region surrounding the first region, and wherein the first liquid has better wettability with respect to the first region than to the second region.

3. The method according to claim 2, wherein the first region is hydrophilic and the second region is water-repelling, and wherein the first liquid contains water.

4. The method according to claim 3, wherein a surface of the anisotropically-shaped member is at least partially hydrophilic.

5. The method according to claim 1, wherein the principal surface (B) of the transfer substrate has grooves that extend in a predetermined direction, and the method further comprises the step of (i) flowing a second liquid, containing the anisotropically-shaped member dispersed therein, onto the principal surface (B) having the grooves, so as to dispose the anisotropically-shaped member on the principal surface (B) in a predetermined orientation, the step (i) being performed before the step (II).

6. The method according to claim 5,
    wherein the transfer substrate is provided on a surface of a roller, and the grooves are formed to extend along a peripheral direction of the roller, and
    wherein, in the step (II), the roller is rotated to bring the principal surface (B) of the transfer substrate into contact with the first liquid disposed in the first region of the substrate, so as to move the anisotropically-shaped member to the region of the first liquid.

7. The method according to claim 6, wherein, in the step (i), a member supply roller with a surface holding the second liquid containing the anisotropically-shaped member dispersed therein is brought into contact with the principal surface (B) of the transfer substrate, so as to flow the second liquid containing the anisotropically-shaped member dispersed therein onto the principal surface (B).

8. The method according to claim 1,
wherein the anisotropically-shaped member is a pillar-like member, and the first region is rectangular in shape, and
wherein the first region is shaped such that a length along a width direction of the first region is at least 0.8 times to at most 1.5 times an average length of a long axis of the pillar-like member.

9. The method according to claim 8, wherein, in the step (II), the anisotropically-shaped member disposed on the principal surface (B) is brought into contact with the first liquid such that the long axis of the pillar-like member is along the width direction of the first region.

10. The method according to claim 1,
wherein the anisotropically-shaped member is a plate-like member, and the first region corresponds in shape to a predetermined surface of the plate-like member, and
wherein, in the step (II), the plate-like member is oriented such that the predetermined surface faces the principal surface (A) when the plate-like member is brought into contact with the first liquid.

* * * * *